United States Patent
Kiyama et al.

(10) Patent No.: US 9,312,340 B2
(45) Date of Patent: Apr. 12, 2016

(54) GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

(71) Applicant: Sumitomo Electric Industries, Ltd., Osaka-shi (JP)

(72) Inventors: Makoto Kiyama, Itami (JP); Keiji Ishibashi, Itami (JP); Akihiro Hachigo, Itami (JP); Naoki Matsumoto, Itami (JP); Fumitake Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/433,237

(22) PCT Filed: Sep. 4, 2014

(86) PCT No.: PCT/JP2014/073291
§ 371 (c)(1),
(2) Date: Apr. 2, 2015

(87) PCT Pub. No.: WO2015/072214
PCT Pub. Date: May 21, 2015

(65) Prior Publication Data
US 2015/0349063 A1    Dec. 3, 2015

(30) Foreign Application Priority Data
Nov. 13, 2013  (JP) .................................. 2013-234993

(51) Int. Cl.
*H01L 21/18*    (2006.01)
*H01L 29/20*    (2006.01)
*H01L 21/762*   (2006.01)

(52) U.S. Cl.
CPC ...... *H01L 29/2003* (2013.01); *H01L 21/76254* (2013.01); *H01L 21/187* (2013.01)

(58) Field of Classification Search
CPC ..................................................... H01L 21/187
USPC .......... 148/33.4; 257/200, 201; 438/455, 459, 438/520
See application file for complete search history.

(56) References Cited

U.S. PATENT DOCUMENTS 8,778,775 B2 * 7/2014 Tauzin .............. H01L 21/02032
257/E21.568
2008/0169483 A1    7/2008 Kasai et al.
(Continued)

FOREIGN PATENT DOCUMENTS

| JP | 2002-134422 A | 5/2002 |
| JP | 2008-010766 A | 1/2008 |

(Continued)

OTHER PUBLICATIONS

International Search Report in PCT International Application No. PCT/JP2014/073291, dated Dec. 2, 2014.

*Primary Examiner* — George Fourson, III
(74) *Attorney, Agent, or Firm* — Venable LLP; Michael A. Sartori

(57) ABSTRACT

A group III nitride composite substrate with a diameter of 75 mm or more includes a support substrate having a thickness $t_s$ of 0.1 mm or more and 1 mm or less and a group III nitride film having a thickness $t_f$, thinner than the thickness $t_s$, of 0.01 mm or more and 0.25 mm or less that are bonded to each other. An absolute value $|\Delta\alpha|$ of a difference $\Delta\alpha$ in thermal expansion coefficient determined by subtracting a thermal expansion coefficient $\alpha_s$ of the support substrate from a thermal expansion coefficient $\alpha_f$ of the group III nitride film is 2.2× $10^{-6}$ K$^{-1}$ or less. A Young's modulus $E_s$ and the thickness $t_s$ of the support substrate, a Young's modulus $E_f$ and the thickness $t_f$ of the group III nitride film, and the difference $\Delta\alpha$ in thermal expansion coefficient satisfy a relation: $t_s^2/t_f \geq 6E_f \cdot |\Delta\alpha|/E_s$.

10 Claims, 12 Drawing Sheets

(56) References Cited

U.S. PATENT DOCUMENTS

| | | | |
|---|---|---|---|
| 2008/0296584 A1* | 12/2008 | Hachigo | H01L 21/2007 257/76 |
| 2009/0127662 A1 | 5/2009 | Okahisa et al. | |
| 2010/0164070 A1 | 7/2010 | Okahisa et al. | |
| 2010/0210089 A1 | 8/2010 | Kasai et al. | |
| 2012/0288995 A1* | 11/2012 | El-Ghoroury | H01L 27/14618 438/107 |
| 2013/0320404 A1* | 12/2013 | Usenko | H01L 29/267 257/200 |
| 2014/0197419 A1* | 7/2014 | Henley | C30B 29/406 257/76 |
| 2015/0140710 A1* | 5/2015 | McLaurin | H01S 5/34333 438/31 |
| 2015/0229108 A1* | 8/2015 | Steigerwald | H01S 5/4093 372/45.01 |

FOREIGN PATENT DOCUMENTS

| | | |
|---|---|---|
| JP | 2009-126722 A | 6/2009 |
| JP | 2010-182936 A | 8/2010 |
| JP | 2013-191861 A | 9/2013 |

* cited by examiner

FIG.10
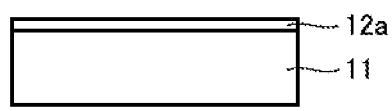
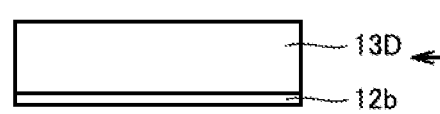
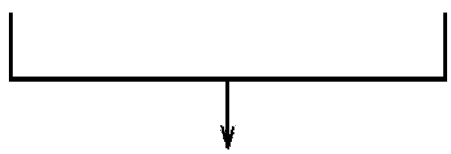
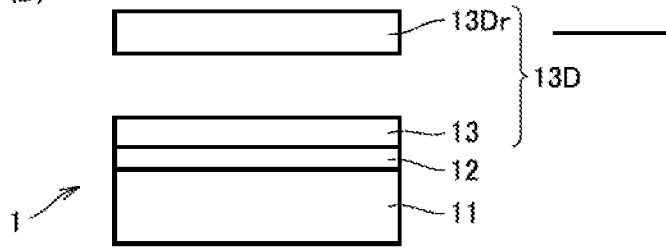

GROUP III NITRIDE COMPOSITE SUBSTRATE AND METHOD FOR MANUFACTURING THE SAME, LAMINATED GROUP III NITRIDE COMPOSITE SUBSTRATE, AND GROUP III NITRIDE SEMICONDUCTOR DEVICE AND METHOD FOR MANUFACTURING THE SAME

TECHNICAL FIELD

The present invention relates to a group III nitride composite substrate and a method for manufacturing the same, a laminated group III nitride composite substrate, and a group III nitride semiconductor device and a method for manufacturing the same.

BACKGROUND ART

Group III nitrides such as GaN have superior semiconductor properties and are therefore used as materials suitable for semiconductor devices.

For example, Japanese Patent Laying-Open No. 2009-126722 (PTD 1) discloses a free-standing group III nitride substrate to be used as a substrate for a semiconductor device. The free-standing group III nitride substrate has a diameter of 25 mm or more and 160 mm or less and a thickness of 100 μm or more and 1000 μm or less. It discloses, as a specific example thereof a free-standing GaN substrate having a diameter of 100 mm and a thickness of 400 μm.

Japanese Patent Laying-Open No. 2008-010766 (PTD 2) discloses a GaN-thin-film-bonded substrate to be used as a substrate for manufacturing a semiconductor device. The GaN-thin-film-bonded substrate includes a heterogeneous substrate whose chemical composition is different from that of GaN, and a GaN thin film having a thickness of 0.1 μm or more and 100 μm or less and bonded to the heterogeneous substrate. It discloses, as a specific example thereof, a GaN-thin-film-bonded substrate having a diameter of 50.8 mm and including a sapphire substrate and a GaN thin film having a thickness of 0.1 μm or 100 μm and bonded to the sapphire substrate.

Japanese Patent Laying-Open No. 2010-182936 (PTD 3) discloses a composite substrate to be used as a substrate for a semiconductor device. The composite substrate includes a support substrate, a nitride semiconductor layer, and a joint layer disposed between the support substrate and the nitride semiconductor layer. It discloses, as a specific example thereof, a composite substrate having a diameter of 50.8 mm and including a sapphire substrate, a GaN layer, and a joint layer formed by press fitting between the substrate and the GaN layer, in which the GaN layer has a thickness of 5 μm to 220 μm.

CITATION LIST

Patent Document
PTD 1: Japanese Patent Laying-Open No. 2009-126722
PTD 2: Japanese Patent Laying-Open No. 2008-010766
PTD 3: Japanese Patent Laying-Open No. 2010-182936

SUMMARY OF INVENTION

Technical Problem

The free-standing group III nitride substrate disclosed in Japanese Patent Laying-Open No. 2009-126722 (PTD 1) involves problems that the substrate is manufactured at high cost and therefore very expensive, and that the substrate is likely to crack, resulting in difficulty in increasing the diameter of the substrate and decreasing the thickness thereof.

Regarding the GaN-thin-film-bonded substrate having the GaN thin film of 0.1 μm in thickness as disclosed in Japanese Patent Laying-Open No. 2008-010766 (PTD 2), ion implantation is performed to form the GaN thin film, which, however, involves a problem that the ion implantation degrades the crystal quality of the GaN thin film. In order to enhance the characteristics of the semiconductor device to be formed, the thickness of the GaN thin film is preferably 10 μm or more. An increase in thickness of the GaN thin film, however, involves a problem that the variation in depth to which ions are implanted from the main surface increases, which accordingly increases the variation in thickness of the GaN thin film in the resultant GaN-thin-film-bonded substrate.

In the GaN-thin-film-bonded substrate disclosed in Japanese Patent Laying-Open No. 2008-010766 (PTD 2), a sapphire substrate or the like which is different from the GaN thin film in thermal expansion coefficient and Young's modulus is used as the heterogeneous substrate whose chemical composition is different from GaN. Therefore, during growth of a GaN-based semiconductor layer on the GaN thin film of the GaN-thin-film-bonded substrate, distortion due to thermal stress occurs to the GaN-thin-film-bonded substrate, which results in a problem that the GaN-based semiconductor layer having a high crystal quality may not be achieved and accordingly high-quality semiconductor devices may not be obtained. In the composite substrate disclosed in Japanese Patent Laying-Open No. 2010-182936 (PTD 3), a sapphire substrate or the like which is different from the GaN layer in thermal expansion coefficient and Young's modulus is used as the support substrate. Therefore, during growth of an epitaxial layer on the GaN layer of the composite substrate, distortion due to thermal stress occurs to the composite substrate, which results in a problem that the epitaxial layer having a high crystal quality may not be achieved and accordingly high-quality semiconductor devices may not be obtained.

The present invention aims to solve the above problems and provide a low-cost, large-diameter, and low-distortion group III nitride composite substrate having a group III nitride film with a large thickness and a high crystal quality and a method for manufacturing the same, a laminated group III nitride composite substrate, and a group III nitride semiconductor device and a method for manufacturing the same.

Solution to Problem

According to an aspect, the present invention is a group III nitride composite substrate with a diameter of 75 mm or more including a support substrate having a thickness $t_s$ of 0.1 mm or more and 1 mm or less and a group III nitride film having a thickness $t_f$ thinner than the thickness $t_s$, of 0.01 mm or more and 0.25 mm or less that are bonded to each other. In the group III nitride composite substrate according to this aspect, an absolute value $|\Delta\alpha|$ of a difference $\Delta\alpha$ in thermal expansion coefficient determined by subtracting a thermal expansion coefficient $\alpha_s$ of the support substrate from a thermal expansion coefficient $\alpha_f$ of the group III nitride film is $2.2\times10^{-6}$ $K^{-1}$ or less, and a Young's modulus $E_s$ and the thickness $t_s$ of the support substrate, a Young's modulus $E_f$ and the thickness $t_f$ of the group III nitride film, and the difference $\Delta\alpha$ in thermal expansion coefficient satisfy a relation defined by a formula (1):

$$t_s^2/t_f \geq 6E_f |\Delta\alpha|/E_s \qquad (1).$$

According to another aspect, the present invention is a laminated group III nitride composite substrate including: the group III nitride composite substrate according to the above aspect; and at least one group III nitride layer disposed on the group III nitride film of the group III nitride composite substrate.

According to still another aspect, the present invention is a group III nitride semiconductor device including at least one group III nitride layer in the laminated group III nitride composite substrate according to the above aspect. According to a further aspect, the present invention is a group III nitride semiconductor device including: the group III nitride film in the group III nitride composite substrate according to the above aspect; and at least one group III nitride layer disposed on the group III nitride film.

According to a still further aspect, the present invention is a method for manufacturing a group III nitride composite substrate according to the above aspect, including the steps of forming a joined substrate with a diameter of 75 mm or more by bonding a support substrate and a group III nitride film donor substrate to each other; and forming the group III nitride composite substrate by cutting the group III nitride film donor substrate of the joined substrate along a plane located inwardly at a predetermined distance from a bonded main surface of the group III nitride film donor substrate. According to a still further aspect, the present invention is a method for manufacturing a group III nitride composite substrate according to the above aspect, including the steps of: forming a joined substrate with a diameter of 75 mm or more by bonding a support substrate and a group III nitride film donor substrate to each other; and forming the group III nitride composite substrate by performing at least one of grinding, polishing, and etching on a main surface of the group III nitride film donor substrate of the joined substrate, the main surface being located opposite to a bonded main surface of the group III nitride film donor substrate.

According to a still further aspect, the present invention is a method for manufacturing a group III nitride semiconductor device including the steps of: preparing the group III nitride composite substrate according to the above aspect; and growing at least one group III nitride layer on the group III nitride film of the group III nitride composite substrate.

Advantageous Effects of Invention

In accordance with the present invention, a low-cost, large-diameter, and low-distortion group III nitride composite substrate having a group III nitride film with a large thickness and a high crystal quality and a method for manufacturing the same, a laminated group III nitride composite substrate, and a group III nitride semiconductor device and a method for manufacturing the same can be provided.

BRIEF DESCRIPTION OF DRAWINGS

FIG. 10 is a schematic cross-sectional view showing an example of the method for manufacturing a group III nitride composite substrate according to the present invention.

DESCRIPTION OF EMBODIMENTS

Figure 1:
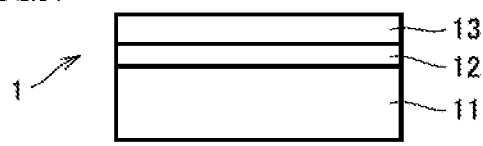
FIG. 1 is a schematic cross-sectional view showing an example of the group III nitride composite substrate according to the present invention.

Description of Embodiments of the Present Invention

A group III nitride composite substrate 1 in an embodiment of the present invention is a group III nitride composite substrate 1 with a diameter of 75 mm or more including a support substrate 11 having a thickness $t_s$ of 0.1 mm or more and 1 mm or less and a group III nitride film 13 having a thickness $t_f$ thinner than the thickness $t_s$, of 0.01 mm or more and 0.25 mm or less that are bonded to each other. In group III nitride composite substrate 1 of this embodiment, an absolute value $|\Delta\alpha|$ of a difference $\Delta\alpha$ in thermal expansion coefficient determined by subtracting a thermal expansion coefficient $\alpha_s$ of support substrate 11 from a thermal expansion coefficient $\alpha_f$ of group III nitride film 13 is $2.2\times10^{-6}$ K$^{-1}$ or less, and a Young's modulus $E_s$ and the thickness $t_s$ of support substrate 11, a Young's modulus $E_f$ and the thickness $t_f$ of group III nitride film 13, and the difference $\Delta\alpha$ in thermal expansion coefficient satisfy a relation defined by the following formula (1):

$$t_s^2/t_f > 6E_f |\Delta\alpha|/E_s \qquad (1).$$

In group III nitride composite substrate 1 of the present embodiment, an absolute value $|\Delta\alpha|$ of a difference $\Delta\alpha$ in thermal expansion coefficient between support substrate 11 and group III nitride film 13 is $2.2\times10^{-6}$ K$^{-1}$ or less, and the Young's modulus $E_s$ and thickness $t_s$ of support substrate 11, the Young's modulus $E_f$ and thickness $t_f$ of group III nitride film 13, and the difference $\Delta\alpha$ in thermal expansion coefficient satisfy the aforementioned formula (1). Accordingly, on this group III nitride film 13, at least one group III nitride layer 20 having a large diameter and a high crystal quality can be grown to thereby enable group III nitride semiconductor devices 4 having excellent characteristics to be fabricated with a high yield.

A laminated group III nitride composite substrate 2 in another embodiment of the present invention includes group III nitride composite substrate 1 of the aforementioned embodiment, and at least one group III nitride layer 20 disposed on group III nitride film 13 of group III nitride composite substrate 1. In laminated group III nitride composite substrate 2 of the present embodiment, group III nitride layer 20 disposed on group III nitride film 13 also has a high crystal quality to thereby enable group III nitride semiconductor devices 4 having excellent characteristics to be fabricated with a high yield.

A group III nitride semiconductor device 4 in still another embodiment of the present invention includes at least one group III nitride layer 20 in laminated group III nitride composite substrate 2 of the aforementioned embodiment. Group III nitride semiconductor device 4 of the present embodiment includes group III nitride layer 20 having a high crystal quality and therefore has excellent characteristics.

A group III nitride semiconductor device 4 in a further embodiment of the present invention includes group III nitride film 13 in group III nitride composite substrate 1 of the aforementioned embodiment, and at least one group III nitride layer 20 disposed on group III nitride film 13. Group III nitride semiconductor device 4 of the present embodiment includes group III nitride layer 20 having a high crystal quality and disposed on group III nitride film 13, and therefore has excellent characteristics.

Group III nitride semiconductor device 4 in this embodiment of the present invention may further include at least one of support substrate 11 and a device support substrate 40. Accordingly, the mechanical strength of group III nitride semiconductor device 4 is kept high.

A method for manufacturing group III nitride composite substrate 1 in a still further embodiment of the present invention is a method for manufacturing group III nitride composite substrate 1 of the aforementioned embodiment including the steps of: forming a joined substrate 1L, 1LS with a diameter of 75 mm or more by bonding a support substrate 11 and a group III nitride film donor substrate 13D to each other; and forming group III nitride composite substrate 1 by cutting group III nitride film donor substrate 13D of joined substrate 1L, 1LS along a plane located inwardly at a predetermined distance from a bonded main surface of group III nitride film donor substrate 13D. The method for manufacturing group III nitride composite substrate 1 of the present embodiment enables large-diameter group III nitride composite substrate 1 having group III nitride film 13 with a large thickness and a high crystal quality to be efficiently manufactured at low cost.

A method for manufacturing group III nitride composite substrate 1 in a still further embodiment of the present invention is a method for manufacturing group III nitride composite substrate 1 of the aforementioned embodiment including the steps of: forming a joined substrate 1L with a diameter of 75 mm or more by bonding a support substrate 11 and a group III nitride film donor substrate 13D to each other; and forming group III nitride composite substrate 1 by performing at least one of grinding, polishing, and etching on a main surface of group III nitride film donor substrate 13D of the joined substrate 1L, the main surface being located opposite to a bonded main surface of group III nitride film donor substrate 13D. The method for manufacturing group III nitride composite substrate 1 of the present embodiment enables large-diameter group III nitride composite substrate 1 having group III nitride film 13 with a large thickness and a high crystal quality to be efficiently manufactured at low cost.

A method for manufacturing group III nitride semiconductor device 4 in a still further embodiment of the present invention includes the steps of: preparing group III nitride composite substrate 1 of the aforementioned embodiment; and growing at least one group III nitride layer 20 on group III nitride film 13 of group III nitride composite substrate 1. The method for manufacturing group III nitride semiconductor device 4 of the present embodiment enables group III nitride semiconductor devices 4 having excellent characteristics to be manufactured with a high yield.

The method for manufacturing group III nitride semiconductor device 4 in this embodiment of the present invention may further include the steps of: further bonding a device support substrate 40 onto group III nitride layer 20; and removing support substrate 11 from group III nitride composite substrate 1. Accordingly, group III nitride semiconductor devices 4 supported by device support substrate 40 and having a high mechanical strength and excellent characteristics can be manufactured with a high yield.

Details of the Embodiments of the Present Invention

Embodiment 1

Group III Nitride Composite Substrate

Referring to FIG. 1, group III nitride composite substrate 1 in an embodiment of the present invention is group III nitride composite substrate 1 with a diameter of 75 mm or more including support substrate 11 having a thickness $t_s$ of 0.1 mm or more and 1 mm or less and group III nitride film 13 having a thickness $t_f$, thinner than the thickness $t_s$, of 0.01 mm or more and 0.25 mm or less that are bonded to each other. In group III nitride composite substrate 1 of the present embodiment, an absolute value $|\Delta\alpha|$ of a difference $\Delta\alpha$ in thermal expansion coefficient determined by subtracting a thermal expansion coefficient $\alpha_s$ (unit: $\times 10^{-6}$ K$^{-1}$) of support substrate 11 from a thermal expansion coefficient $\alpha_f$ (unit: $\times 10^{-6}$ K$^{-1}$) of group III nitride film 13 is $2.2\times10^{-6}$ K$^{-1}$ or less, and a Young's modulus $E_s$ (unit: GPa) and the thickness $t_s$ (unit: mm) of support substrate 11, a Young's modulus $E_f$ (unit: GPa) and the thickness $t_f$ (unit: mm) of group III nitride film 13, and the difference Δα (unit: ×10⁻⁶ K⁻¹) in thermal expansion coefficient satisfy a relation defined by the following formula (1):

$$t_s^2/t_f \geq 6E_f|\Delta\alpha|/E_s \quad (1).$$

In group III nitride composite substrate 1 of the present embodiment, an absolute value |Δα| of a difference Δα in thermal expansion coefficient between support substrate 11 and group III nitride film 13 is 2.2×10⁻⁶ K⁻¹ or less, and Young's modulus $E_s$ and thickness $t_s$ of support substrate 11, Young's modulus $E_f$ and thickness $t_f$ of group III nitride film 13, and the difference Δα in thermal expansion coefficient satisfy the aforementioned formula (1). Accordingly, on this group III nitride film 13, at least one group III nitride layer 20 having a large diameter and a high crystal quality can be grown to thereby enable group III nitride semiconductor devices 4 having excellent characteristics to be fabricated with a high yield.

(Form of Group III Nitride Composite Substrate)

The form of group III nitride composite substrate 1 of the present embodiment is not particularly limited, and may either be a form in which support substrate 11 and group III nitride film 13 are directly bonded to each other or a form in which support substrate 11 and group III nitride film 13 are indirectly bonded to each other with a joint film 12 interposed therebetween. In order to increase the joint strength given by the bonding, the form in which support substrate 11 and group III nitride film 13 are indirectly bonded to each other with joint film 12 interposed therebetween is preferred.

In order to increase the number of semiconductor device chips produced from one composite substrate, the diameter of group III nitride composite substrate 1 of the present embodiment is 75 mm or more, preferably 100 mm or more, more preferably 125 mm or more, and still more preferably 150 mm or more. In order to decrease the warp of the composite substrate and increase the yield of semiconductor devices, the diameter of group III nitride composite substrate 1 is preferably 300 mm or less and more preferably 200 mm or less.

(Thickness of Support Substrate)

In order to support group III nitride film 13, support substrate 11 has a thickness $t_s$ of 0.1 mm or more, preferably 0.2 mm or more, and more preferably 0.4 mm or more. In order to enhance ease of handling and reduce the cost, support substrate 11 has a thickness $t_s$ of 1 mm or less, preferably 0.8 mm or less, and more preferably 0.7 mm or less.

(Thickness of Group III Nitride Film)

In order to allow a group III nitride layer having a high crystal quality to be grown on group III nitride film 13 and thereby allow group III nitride semiconductor devices having excellent characteristics to be formed with a high yield, group III nitride film 13 has a thickness $t_f$ of 0.01 mm or more, preferably 0.02 mm or more, and more preferably 0.05 mm or more. In order to reduce the amount of an expensive group III nitride to be used and thereby reduce the cost, group III nitride film 13 has a thickness $t_f$ of 0.25 mm or less, preferably 0.15 mm or less, and more preferably 0.1 mm or less.

(Difference in Thermal Expansion Coefficient Between Support Substrate and Group III Nitride Film)

Regarding an absolute value |Δα| of a difference Δα in thermal expansion coefficient determined by subtracting a thermal expansion coefficient $α_s$ of support substrate 11 from a thermal expansion coefficient $α_f$ of group III nitride film 13, in order to allow a group III nitride layer having a high crystal quality to be grown on group III nitride film 13 without causing crack and/or peeling and thereby allow group III nitride semiconductor devices having excellent characteristics to be formed with a high yield, the absolute value of the difference is 2.2×10⁻⁶ K⁻¹ or less, preferably 2.0×10⁻⁶ K⁻¹ or less, and more preferably 1.5×10⁻⁶ K⁻¹ or less.

(Relation of Young's Modulus, Thickness, and Thermal Expansion Coefficient Difference Between Support Substrate and Group III Nitride Film)

In order to allow a group III nitride layer having a high crystal quality to be grown on group III nitride film 13 without causing crack and/or peeling and thereby allow group III nitride semiconductor devices having excellent characteristics to be formed with a high yield, Young's modulus $E_s$ (unit: GPa) and thickness $t_s$ (unit: mm) of support substrate 11, Young's modulus $E_f$ (unit: GPa) and thickness $t_f$ (unit: mm) of group III nitride film 13, and difference Δα (unit: 10⁻⁶ K⁻¹) in thermal expansion coefficient satisfy a relation defined by the following formula (1):

$$t_s^2/t_f \geq 6E_f|\Delta\alpha|/E_s \quad (1).$$

When at least one group III nitride layer is grown on group III nitride film 13 of group III nitride composite substrate 1, group III nitride film 13 bonded to support substrate 11 of group III nitride composite substrate 1 is subjected to a thermal stress $σ_T$ (unit: Pa) which is generated due to difference Δα (unit: ×10⁻⁶ K⁻¹) in thermal expansion coefficient determined by subtracting thermal expansion coefficient $α_s$ (unit: ×10⁻⁶ K⁻¹) of support substrate 11 from thermal expansion coefficient $α_f$ (unit: ×10⁻⁶ K⁻¹) of group III nitride film 13, and is represented by the following formula (2):

$$σ_T = E_f|\Delta\alpha|\cdot\Delta T/(1-v_f) \quad (2)$$

where it is supposed that thickness $t_f$ (unit: mm) of group III nitride film 13 is smaller than thickness $t_s$ (unit: mm) of support substrate 11, $E_f$ is Young's modulus (unit: GPa) of group III nitride film 13, $v_f$ is Poisson's ratio (unit: dimensionless) of group III nitride film 13, ΔT is a temperature difference (unit: ° C.) determined by subtracting a formation temperature $T_b$ (unit: ° C.) of group III nitride composite substrate 1 from a growth temperature $T_b$ (unit: ° C.) of the group III nitride layer, and Δα is the difference in thermal expansion coefficient.

Further, when at least one group III nitride layer is grown on group III nitride film 13 of group III nitride composite substrate 1, a radius of curvature R (unit: m) due to warp of group III nitride composite substrate 1 is represented, based on the Stoney's equation, by the following formula (3):

$$R = E_s/\{6(1-v_s)σ_T\}\cdot t_s^2/t_f \quad (3)$$

where $E_S$ is Young's modulus (unit: GPa) of the support substrate, $t_s$ is thickness (unit: mm) of the support substrate, $t_f$ is thickness (unit: mm) of the group III nitride film, and $σ_T$ is thermal stress (unit: Pa) applied to the group III nitride film.

The formula (2) is substituted in the formula (3) to obtain the following formula (4):

$$R = E_s/(E_f|\Delta\alpha|\cdot\Delta T)/\{6(1-v_S)/(1-v_f)\}\cdot t_s^2/t_f \quad (4).$$

Here, in the case of Δα>0, the composite substrate deforms in a convex shape in the direction toward group III nitride film 13 at the growth temperature of the group III nitride layer. In the case of Δα<0, the composite substrate deforms in a concave shape in the direction away from group III nitride film 13 at the growth temperature of the group III nitride layer. The above formula (4) is deformed to the following formula (5):

$$t_s^2/t_f = [R\Delta T(1-v_f)/6(1-v_S)]E_f|\Delta\alpha|/E_S \quad (5).$$

This formula (5) indicates that parameter $t_s^2/t_f$ (also referred to as parameter Y, which is applied as well in the following), which is a parameter regarding respective thicknesses of support substrate 11 and group III nitride film 13, has a predetermined relation to parameter $E_f|\Delta\alpha|/E_S$ (also referred to as parameter X, which is applied as well in the following), which is a parameter regarding respective Young's moduli of support substrate 11 and group III nitride film 13 and the thermal expansion coefficient difference therebetween.

With respect to $E_f \cdot |\Delta\alpha|/E_S$ (parameter X) and $t_s^2/t_f$ (parameter Y), the quality of the uniformity of distribution, in a plane parallel to a main surface, of the carrier concentration in group III nitride layer 20 grown on group III nitride film 13 of group III nitride composite substrate 1 was evaluated. As a result, it has been found that the uniformity of distribution, in a plane parallel to a main surface, of the carrier concentration in group III nitride layer 20 is satisfactory when Young's modulus $E_s$ and thickness $t_s$ of support substrate 11, Young's modulus $E_f$ and thickness $t_f$ of group III nitride film 13, and the difference $\Delta\alpha$ in thermal expansion coefficient satisfy a relation defined by the following formula (1):

$$t_s^2/t_f \geq 6E_f \cdot |\Delta\alpha|/E_s \qquad (1).$$

(Support Substrate)

Support substrate 11 is not particularly limited as long as its thickness $t_s$ is 0.1 mm or more and 1 mm or less and satisfies the relation defined by the above formula (1). In order to reduce the amount of an expensive group III nitride to be used and thereby reduce the cost, however, support substrate 11 is preferably a heterogeneous-composition substrate having a different chemical composition of the group III nitride. In view of the above, support substrate 11 is preferably, for example, an oxide substrate formed of an oxide such as mullite, zirconia, mullite-YSZ (yttria-stabilized zirconia), sapphire, alumina, or the like, a silicon substrate formed of silicon (Si), a silicon carbide substrate formed of silicon carbide (SiC), or a metal substrate formed of molybdenum (Mo), tungsten (W), copper tungsten (CuW), or the like. In order to manufacture a vertical device including group III nitride composite substrate 1, support substrate 11 is preferably an electrically conductive support substrate, and is preferably a metal substrate such as Mo substrate, W substrate, or the like, for example.

(Group III Nitride Film)

Group III nitride film 13 is not particularly limited as long as its thickness $t_f$ is 0.01 mm or more and 0.25 mm or less and satisfies the relation defined by the above formula (1). As long as group III nitride film 13 is a group III nitride film formed of a group III nitride, a dopant may be added thereto for the purpose of adjusting the carrier concentration.

(Joint Film)

Joint film 12 is not particularly limited as long as it can join support substrate 11 and group III nitride film 13 to each other. In order to provide a high ability of joining support substrate 11 and group III nitride film 13 to each other, joint film 12 is preferably a silicon oxide ($SiO_2$) film, a silicon nitride ($SiN_x$) film, a titanium oxide ($TiO_2$) film, a gallium oxide ($Ga_2O_3$) film, or the like. In order to manufacture a vertical device including group III nitride composite substrate 1, joint film 12 is preferably an electrically conductive joint film, and is preferably a $TiO_2$ film, a $Ga_2O_3$ film, or the like, for example.

Embodiment 2

Laminated Group III Nitride Composite Substrate

Figure 2:
FIG. 2 is a schematic cross-sectional view showing an example of the laminated group III nitride composite substrate according to the present invention.
Figure 3:
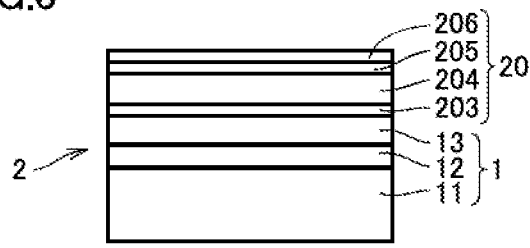
FIG. 3 is a schematic cross-sectional view showing another example of the laminated group III nitride composite substrate according to the present invention.

Referring to FIGS. 2 and 3, laminated group III nitride composite substrate 2 in another embodiment of the present invention includes group III nitride composite substrate 1 of Embodiment 1, and at least one group III nitride layer 20 disposed on group III nitride film 13 of group III nitride composite substrate 1.

In laminated group III nitride composite substrate 2 of the present embodiment, group III nitride layer 20 disposed on group III nitride film 13 also has a high crystal quality to thereby enable group III nitride semiconductor devices having excellent characteristics to be fabricated with a high yield.

In laminated group III nitride composite substrate 2 of the present embodiment, the configuration of group III nitride layer 20 disposed on group III nitride film 13 varies depending on the type of the group III nitride semiconductor device to be fabricated. Referring to FIG. 2, in the case where an SBD (schottky barrier diode) which is an example of the electronic device is to be fabricated as the group III nitride semiconductor device, group III nitride layer 20 may include, for example, an $n^+$-GaN layer 201 (having a carrier concentration of $2\times10^{18}$ cm$^{-3}$ for example) and an $n^-$-GaN layer 202 (having a carrier concentration of $\times10^{16}$ cm$^{-3}$ for example). Referring to FIG. 3, in the case where a PND (pn junction diode) which is another example of the electronic device is to be fabricated as the group III nitride semiconductor device, group III nitride layer 20 may include, for example, an $n^+$-GaN layer 203 (having a carrier concentration of $2\times10^{18}$ cm$^{-3}$ for example), an $n^-$-GaN layer 204 (having a carrier concentration of $1\times10^{16}$ cm$^{-3}$ for example), a $p^-$-GaN layer 205 (having an Mg concentration of $5\times10^{17}$ cm$^{-3}$ for example), and a $p^+$-GaN layer 206 (having an Mg concentration of $1\times10^2$ cm$^{-3}$ for example).

Embodiment 3

Group III Nitride Semiconductor Device

Referring to FIGS. 2 to 9, group III nitride semiconductor device 4 in still another embodiment of the present invention includes at least group III nitride layer 20 in laminated group III nitride composite substrate 2 of Embodiment 2. Namely, group III nitride semiconductor device 4 of the present embodiment which is of a first type includes at least group III nitride layer 20. Group III nitride semiconductor device 4 of the present embodiment includes group III nitride layer 20 having a high crystal quality and therefore has excellent characteristics.

Referring to FIGS. 1, 5, 6, 8, and 9, group III nitride semiconductor device 4 in a further embodiment of the present invention includes group III nitride film 13 in group III nitride composite substrate 1 of Embodiment 1, and at least one group III nitride layer 20 disposed on group III nitride film 13. Namely, group III nitride semiconductor device 4 of the present embodiment which is of a second type also includes group III nitride film 13 in addition to group III nitride layer 20 included in the first type. Group III nitride semiconductor device 4 of the present embodiment includes group III nitride layer 20 having a high crystal quality and disposed on group III nitride film 13, and therefore has excellent characteristics.

Referring to FIGS. 4 to 9, group III nitride semiconductor device 4 of the aforementioned embodiment preferably further includes at least one of support substrate 11 and device support substrate 40, in addition to group III nitride layer 20 included in the first type or in addition to group III nitride film 13 and group III nitride layer 20 included in the second type. Group III nitride semiconductor device 4 thus further includes at least one of support substrate 11 and device support substrate 40, and accordingly its mechanical strength is kept high. Here, group III nitride semiconductor device 4 further including at least one of support substrate 11 and device support substrate 40 is thus classified into a third type which further includes support substrate 11 shown in FIGS. 6 and 9 and a fourth type which further includes device support substrate 40 shown in FIGS. 4, 5, 7, and 8.

Figure 4:
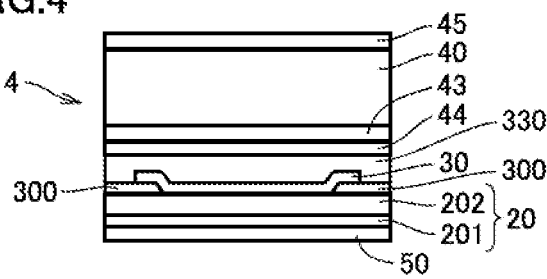
FIG. 4 is a schematic cross-sectional view showing an example of the group III nitride semiconductor device according to the present invention.
Figure 5:
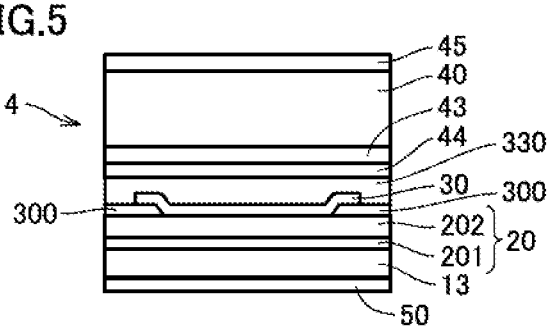
FIG. 5 is a schematic cross-sectional view showing another example of the group III nitride semiconductor device according to the present invention.
Figure 6:
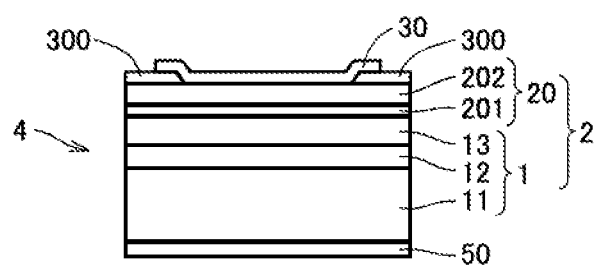
FIG. 6 is a schematic cross-sectional view showing still another example of the group III nitride semiconductor device according to the present invention.

The configuration of group III nitride semiconductor device 4 of the present embodiment varies depending on the type of the group III nitride semiconductor device. Referring to FIGS. 4 to 6, group III nitride semiconductor device 4 which is an SBD (schottky barrier diode) may for example include, in the case of the first type, group III nitride layer 20 which includes an $n^+$-GaN layer 201 (having a carrier concentration of $2\times10^{18}$ cm$^{-3}$ for example) and an $n^-$-GaN layer 202 (having a carrier concentration of $1\times10^{16}$ cm$^{-3}$ for example), a first electrode 30 which is a schottky electrode disposed on the $n^-$-GaN layer 202 side of group III nitride layer 20, and a second electrode 50 which is an ohmic electrode disposed on the $n^+$-GaN layer 201 side of group III nitride layer 20.

Figure 7:
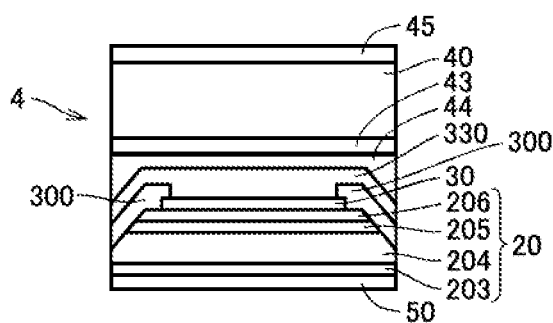
FIG. 7 is a schematic cross-sectional view showing a further example of the group III nitride semiconductor device according to the present invention.
Figure 8:
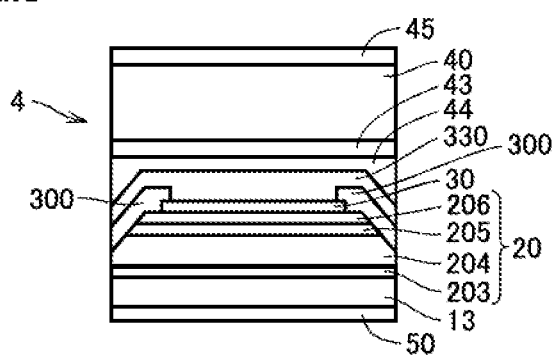
FIG. 8 is a schematic cross-sectional view showing a still further example of the group III nitride semiconductor device according to the present invention.
Figure 9:
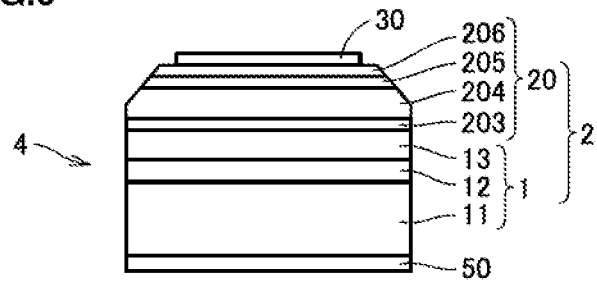
FIG. 9 is a schematic cross-sectional view showing a still further example of the group III nitride semiconductor device according to the present invention.

Referring to FIGS. 7 to 9, group III nitride semiconductor device 4 which is a PND (pn junction diode) may for example include, in the case of the first type, group III nitride layer 20 which includes an $n^+$-GaN layer 203 (having a carrier concentration of $2\times10^{18}$ cm$^{-3}$ for example), an $n^-$-GaN layer 204 (having a carrier concentration of $1\times10^{16}$ cm$^{-3}$ for example), a $p^-$-GaN layer 205 (having an Mg concentration of $5\times10^{17}$ cm$^{-3}$ for example), and a $p^+$-GaN layer 206 (having an Mg concentration of $1\times10^{20}$ cm$^{-3}$ for example), a first electrode 30 which is an ohmic electrode disposed on the $p^+$-GaN layer 206 side of group III nitride layer 20, and a second electrode 50 which is an ohmic electrode disposed on the $n^+$-GaN layer 203 side of group III nitride layer 20.

Referring to FIGS. 5, 6, 8, and 9, in group III nitride semiconductor device 4 of the second type which includes group III nitride film 13 in addition to the components of group III nitride semiconductor device 4 of the first type, group III nitride film 13 is disposed for example on the second electrode 50 side of group III nitride layer 20.

Referring to FIGS. 6 and 9, in group III nitride semiconductor device 4 of the third type including support substrate 11 in addition to the components of group III nitride semiconductor device 4 of the first type or the second type, support substrate 11 is disposed for example between group III nitride layer 20 and second electrode 50. Support substrate 11 is derived from support substrate 11 of group III nitride composite substrate 1 of the first embodiment.

Referring to FIGS. 4, 5, 7, and 8, in group III nitride semiconductor device 4 of the fourth type further including device support substrate 40 in addition to the components of group III nitride semiconductor device 4 of the first type or the second type, device support substrate 40 is disposed for example on the first electrode 30 side of group III nitride layer 20. In order to support group III nitride layer 20 and have electrical conductivity, device support substrate 40 is preferably an Si substrate or a metal substrate such as Mo substrate, W substrate, CuW substrate, or the like.

Embodiment 4

Method for Manufacturing Group III Nitride Composite Substrate

Embodiment 4-1

One Method for Manufacturing Group III Nitride Composite Substrate

Figure 11:
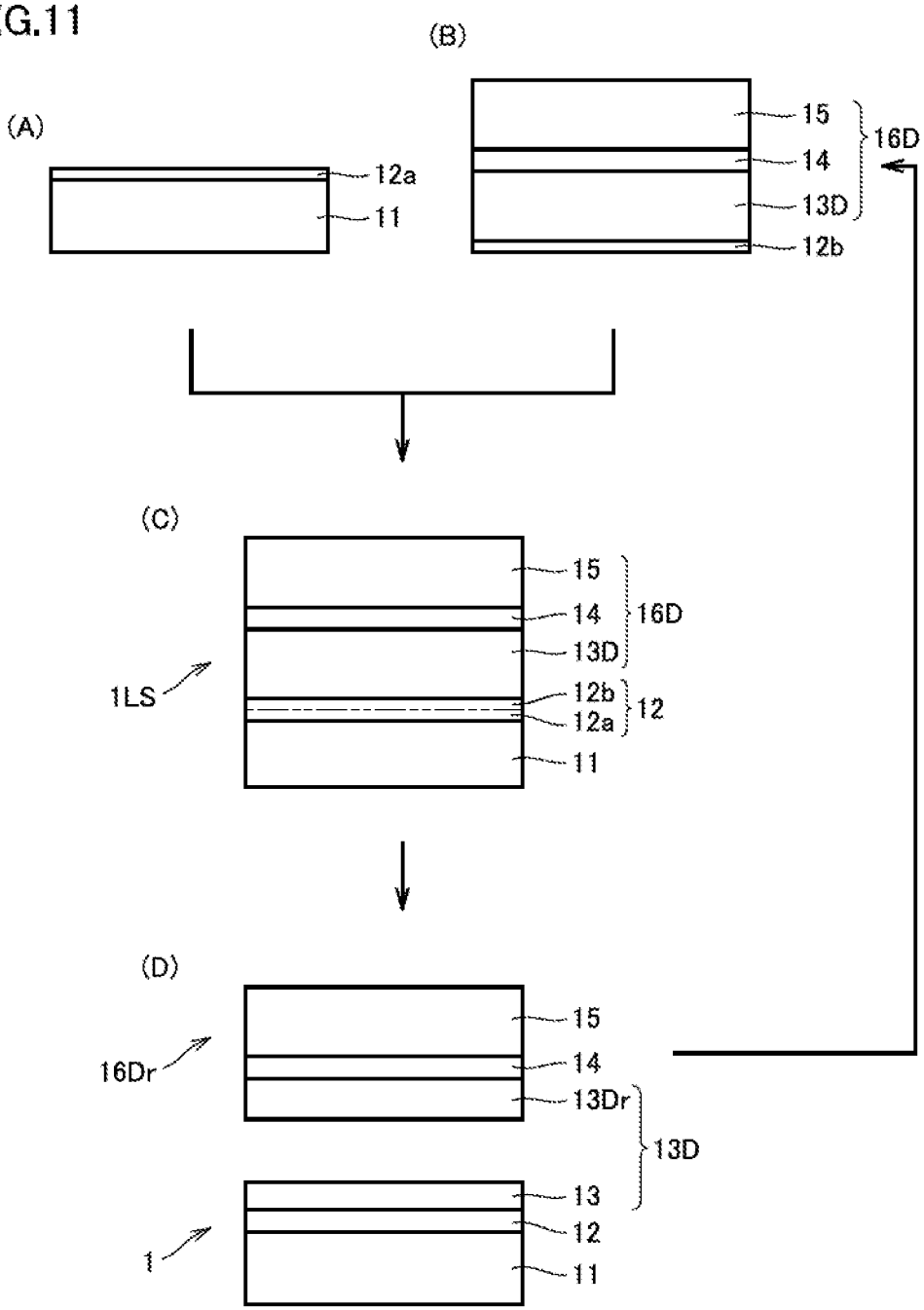
FIG. 11 is a schematic cross-sectional view showing another example of the method for manufacturing a group III nitride composite substrate according to the present invention.

Referring to FIGS. 10 and 11, a method for manufacturing group III nitride composite substrate 1 in a further embodiment of the present invention is a method for manufacturing group III nitride composite substrate 1 of Embodiment 1, including the steps of: forming joined substrate 1L, 1LS with a diameter of 75 mm or more by bonding support substrate 11 and group III nitride film donor substrate 13D to each other (FIG. 10 (A) to (C), FIG. 11 (A) to (C)); and forming group III nitride composite substrate 1 by cutting group III nitride film donor substrate 13D of joined substrate 1L, 1LS along a plane located inwardly at a predetermined distance from a bonded main surface of group III nitride film donor substrate 13D (FIG. 10 (D), FIG. 11 (D)).

The method for manufacturing group III nitride composite substrate 1 of the present embodiment enables large-diameter group III nitride composite substrate 1 having group III nitride film 13 with a large thickness and a high crystal quality to be efficiently manufactured at low cost.

Here, in the step of forming group III nitride composite substrate 1, the predetermined distance of the plane located inwardly from the bonded main surface of group III nitride film donor substrate 13D, for cutting group III nitride film donor substrate 13D along the plane at this distance, is determined depending on the thickness of group III nitride film 13 of group III nitride composite substrate 1 to be manufactured.

In addition, in the step of forming group III nitride composite substrate 1, group III nitride film donor substrate 13D is cut to form group III nitride film 13, and thereafter at least one of grinding, polishing, and etching can be performed on the main surface of group III nitride film 13 opposite to the bonded main surface thereof, to thereby reduce the thickness of group III nitride film 13. In particular, in order to reduce a damaged layer of group III nitride film 13 formed because of cutting of group III nitride film donor substrate 13D and to planarize the main surface, it is preferable to polish the main surface, which has been obtained by the cutting, of group III nitride film 13 in group III nitride composite substrate 1. In order to reduce the thickness variation and the off-angle variation of group III nitride film 13, the method for polishing is preferably precision polishing based on CMP (Chemical Mechanical Polishing), chemical polishing, or the like.

In view of the above, the predetermined distance of the plane located inwardly from the bonded main surface of group III nitride film donor substrate 13D, for cutting group III nitride film donor substrate 13D along the plane at this distance, is preferably the sum determined by adding a polishing allowance, which is a portion to be removed away by polishing, to the thickness of group III nitride film 13 of group III nitride composite substrate 1 to be manufactured.

Regarding the method for manufacturing group III nitride composite substrate 1 of the present embodiment, group III nitride film donor substrate 13D is cut along a plane located inwardly at a predetermined distance from the bonded main surface of group III nitride film donor substrate 13D in joined substrate 1L, 1LS to thereby form group III nitride film 13, and preferably at least one of grinding, polishing, and etching is performed on the main surface of group III nitride film 13 that is opposite to the bonded main surface, to thereby adjust the film thickness by reducing it. Accordingly, group III nitride composite substrate 1 including group III nitride film 13 having a desired thickness of 0.01 mm or more and 0.25 mm or less is obtained.

As for the method for manufacturing group III nitride composite substrate 1 of the present embodiment, the group III nitride film donor substrate is cut in the step of forming the group III nitride composite substrate. Thus, in order to improve the workability and the efficiency of manufacture, the thickness of group III nitride film donor substrate 13D to be used is preferably larger than 0.5 mm, more preferably 1 mm or more, and still more preferably 2 mm or more.

(Step of Forming Joined Substrate)

Referring to FIG. 10 (A) to (C) and FIG. 11 (A) to (C), the step of forming joined substrate 1L, 1LS includes the sub step of forming a joint film 12a on a main surface of support substrate 11 (FIG. 10 (A), FIG. 11 (A)), the sub step of forming a joint film 12b on a main surface of group III nitride film donor substrate 13D (FIG. 10 (B), FIG. 11 (B)), and the sub step of bonding joint film 12a formed on support substrate 11 and joint film 12b formed on group III nitride film donor substrate 13D to each other (FIG. 10 (C), FIG. 11 (C)).

Referring to FIG. 10 (A) and FIG. 11 (A), in the sub step of forming joint film 12a on the main surface of support substrate 11, joint film 12a is to be integrated with joint film 12b, which will be described later herein, to form joint film 12, and is made of the same material as joint film 12. The method for forming joint film 12a is not particularly limited as long as the method is suitable for forming joint film 12a. In order to efficiently form joint film 12a of good quality, however, the method is preferably sputtering, CVD (Chemical Vapor Deposition), PLD (Pulsed Laser Deposition), MBE (Molecular Beam Epitaxy), electron-beam vapor deposition, or the like. CVD is particularly preferred since it enhances the quality of the joint film and enhances the film deposition rate. Among different CVD methods, P-CVD (Plasma-Chemical Vapor Deposition) and the like are more preferred since they enable the film to be deposited at a low temperature and at a high deposition rate, and LP-CVD (Low Pressure-Chemical Vapor Deposition) and the like are still more preferred since they enhance the film quality and facilitate mass production.

Further, in order to improve the joint strength, annealing may be performed after joint films 12a, 12b are formed and before they are joined together. This annealing can degas joint films 12a, 12b to thereby densify joint films 12a, 12b.

Furthermore, in order to increase the joint strength between support substrate 11 and group III nitride film donor substrate 13D, a main surface of joint film 12a is preferably mirror-polished (into a mirror-finished surface having an RMS (root mean square roughness) of 0.3 nm or less). The method for polishing the main surface of joint film 12a is not particularly limited. For example, CMP (Chemical Mechanical Polishing) or the like is used. In order to improve the cleanliness of the joint film for the purpose of increasing the joint strength, non-abrasive polishing may be performed, after CMP, with a solution containing no abrasive. In order to enhance the effect of removing the abrasive, non-abrasive polishing may be performed by means of an alkali such as KOH, TMAH (tetramethylammonium hydroxide), or an acid such as HCl, $HNO_3$, $H_2SO_4$. In addition, in order to improve the cleanliness of the joint film for the purpose of increasing the joint strength, scrub cleaning using sponge, brush, or the like may be performed. In addition, two-fluid cleaning, megasonic cleaning, ultrasonic cleaning, or the like may suitably be performed.

Referring to FIG. 10 (B) and FIG. 11 (B), in the sub step of forming joint film 12b on the main surface of group III nitride film donor substrate 13D, group III nitride film donor substrate 13D is a donor substrate which is to provide group III nitride film 13 after a part thereof is separated in the subsequent sub step. The method for preparing this group III nitride film donor substrate 13D is not particularly limited. In order to produce group III nitride film donor substrate 13D of good crystallinity, suitable methods are gas phase methods such as HVPE (Hydride Vapor Phase Epitaxy), MOVPE (Metal Organic Vapor Phase Epitaxy), MBE (Molecular Beam Epitaxy), and sublimation method, as well as liquid phase methods such as flux method, high nitrogen pressure solution method, ammonothermal method, and the like.

The material and the method for forming joint film 12b as well as polishing of a main surface of joint film 12b are similar to the material and the method for forming the above-described joint film 12a as well as polishing of the main surface of joint film 12a.

Referring to FIG. 10 (C) and FIG. 11 (C), in the sub step of bonding joint film 12a formed on support substrate 11 and joint film 12b formed on group III nitride film donor substrate 13D to each other, the method for bonding them together is not particularly limited. Suitable methods include: a direct bonding method according to which respective surfaces to be bonded to each other are cleaned, directly bonded together, and thereafter heated to approximately 600° C. to 1200° C. so that the joint films are joined together; a surface activated bonding method according to which the surfaces to be bonded to each other are cleaned, subjected to an activation treatment by means of plasma or ions, and thereafter joined together under a low-temperature atmosphere of room temperature (25° C. for example) to 400° C.; a high-pressure bonding method according to which the surfaces to be bonded to each other are cleaned with a chemical solution and pure water and thereafter subjected to a high pressure on the order of 0.1 MPa to 10 MPa so that the joint films are joined together, a high vacuum bonding method according to which the surfaces to be bonded to each other are cleaned with a chemical solution and pure water, and thereafter joined together under a high vacuum atmosphere on the order of $10^{-6}$ Pa to $10^{-3}$ Pa, and the like. Any of the above-referenced bonding methods can increase the temperature to approximately 600° C. to 1200° C. after the joint films are joined together to thereby further increase the joint strength. In particular, the surface activated bonding method, the high pressure bonding method, and the high vacuum bonding method exhibit a higher effect of increasing the joint strength through the heating to approximately 600° C. to 1200° C. after the joint films are joined together.

The above bonding causes joint film 12a and joint film 12b to be joined together and thereby integrated into joint film 12. Support substrate 11 and group III nitride film donor substrate 13D are joined together with joint film 12 interposed therebetween to thereby form joined substrate 1L, 1LS.

Respective surfaces of joint films 12a and 12b to be bonded to each other can thus be activated before being bonded to each other, to thereby increase the joint strength. Activation of the surfaces to be bonded is not particularly limited. The surfaces are preferably activated through plasma treatment, ion treatment, chemical treatment by means of a chemical solution, cleaning, CMP treatment, and the like, since they have a high activation effect.

(Step of Forming Group III Nitride Composite Substrate)

Referring to FIG. 10 (D) and FIG. 11 (D), in the step of forming group III nitride composite substrate 1, group III nitride film donor substrate 13D is cut along a plane located inwardly at a predetermined distance from the bonded main surface of group III nitride film donor substrate 13D in joined substrate 1L, 1LS. Accordingly, the donor substrate is separated into group III nitride film 13, which is joined to support substrate 11 with joint film 12 interposed therebetween, and a remaining group III nitride film donor substrate 13Dr. Thus, group III nitride composite substrate 1 in which support substrate 11 and group III nitride film 13 are bonded to each other with joint film 12 interposed therebetween is formed.

The method for cutting group III nitride film donor substrate 13D is not particularly limited, and may be any of the methods such as wire saw, blade saw, laser processing, electrical discharge processing, water jet, and the like.

As to cutting of group III nitride film donor substrate 13D by means of a wire saw, it is preferable to use a fixed-abrasive wire in order to flatly cut group III nitride film donor substrate 13D of a large diameter, and it is preferable to use a thin wire in order to reduce a cutting allowance, which is a portion to be removed away through cutting. For reduction of the cutting allowance, loose-abrasive processing is preferred. In addition, as to cutting of group III nitride film donor substrate 13D by means of a wire saw, it is preferable to increase the tension of the wire and increase the wire speed, in order to reduce bending of the wire caused by the cut resistance and thereby improve the thickness precision and the flatness. For this purpose, a high-rigidity wire saw apparatus is preferred.

It is also preferable to swing the wire and vibrate group III nitride film donor substrate 13D in synchronization therewith, in order to reduce the cut resistance and thereby improve the thickness precision and the flatness. Specifically, the cutting resistance can be reduced in the following manner. In the case where the wire saw is positioned at a right angle or an angle close thereto relative to the direction in which group III nitride film donor substrate 13D is cut, group III nitride film donor substrate 13D is moved along the direction in which it is cut. In the case where the wire saw is located at an angle further from the right angle relative to the direction in which group III nitride film donor substrate 13D is cut, group III nitride film donor substrate 13D is moved in the direction opposite to the direction in which it is cut.

The group III nitride such as GaN is more brittle and more prone to crack as compared with sapphire, SiC, and the like, and therefore cannot be cut appropriately by a cutting method similar to that used for sapphire and SiC. It is therefore necessary for cutting of the group III nitride to further reduce the cut resistance. In order to reduce the cut resistance and thereby enhance the thickness precision and the flatness, it is preferable that the resistance coefficient RC (N) is within an appropriate range, specifically a range of 4000 or more and 5000 or less. The resistance coefficient RC (N) is represented by $(\eta \times Q \times V)/(L \times P \times n)$ where $\eta$ (Pa·s) is the viscosity of a machining fluid for slicing, Q (m$^3$/s) is the flow rate of the machining fluid, V (m/s) is the wire linear speed, L (m) is the maximum cut length, P (m/s) is the cut speed, and n is the number of workpieces that are cut simultaneously.

Regarding the method for manufacturing a group III nitride composite substrate in the present embodiment, it is preferable to polish the main surface of group III nitride film 13 in group III nitride composite substrate 1 obtained through cutting, in order to remove a damaged layer of group III nitride film 13 formed by the cutting and thereby keep the crystal quality high and to smooth the main surface.

Accordingly, regarding the method for manufacturing a group III nitride composite substrate in the present embodiment, the predetermined distance of the plane located inwardly from the bonded main surface of group III nitride film donor substrate 13D, for cutting group III nitride film donor substrate 13D in joined substrate 1L, 1LS along the plane at this distance, is preferably the sum determined by adding a polishing allowance, which is a portion to be removed away by polishing, to the thickness of group III nitride film 13 of group III nitride composite substrate 1 to be manufactured. Here, the polishing allowance is not particularly limited, but preferably 0.01 mm or more, more preferably 0.02 mm or more, and still more preferably 0.03 mm or more, in order to remove a damaged layer. Meanwhile, in order to reduce the material loss of group III nitride film donor substrate 13D, the polishing allowance is preferably 0.1 mm or less, more preferably 0.08 mm or less, and still more preferably 0.06 mm or less.

Referring also to FIG. 10 (D) and (B) and FIGS. 11 (D) and (B), the remaining group III nitride film donor substrate 13Dr may have its main surface polished so that it can be used repeatedly.

(Use of Support-Incorporated Group III Nitride Film Donor Substrate)

Referring to FIG. 11 (B) to (D), a support-incorporated group III nitride film donor substrate 16D in which a support 15 for the group III nitride film donor substrate is bonded to group III nitride film donor substrate 13D can be used to produce a group III nitride composite substrate 1 in a similar manner to the above. Support-incorporated group III nitride film donor substrate 16D has support 15 for the group III nitride film donor substrate that supports group III nitride film donor substrate 13D, and can therefore be used repeatedly even if group III nitride film donor substrate 13D becomes thinner to such an extent that substrate 13D cannot stand by itself.

Regarding support-incorporated group III nitride film donor substrate 16D, the form in which support 15 for the group III nitride film donor substrate and group III nitride film donor substrate 13D are bonded to each other is not particularly limited. In order to increase the joint strength of the bonding, however, it is preferable to dispose a joint film 14 therebetween. Support 15 for the group III nitride film donor substrate is also not particularly limited. In order to increase the support strength and prevent occurrence of crack and warp, however, it is preferable that support 15 is formed of a material having similar physical properties to support substrate 11. While joint film 14 is not particularly limited, it may preferably be any of SiO$_2$ film, SiN film, TiO$_2$ film, Ga$_2$O$_3$ film, and the like, since these films provide a good joint to support 15 for the group III nitride film donor substrate and group III nitride film donor substrate 13D.

Embodiment 4-2

Another Method for Manufacturing Group III Nitride Composite Substrate

Figure 12:
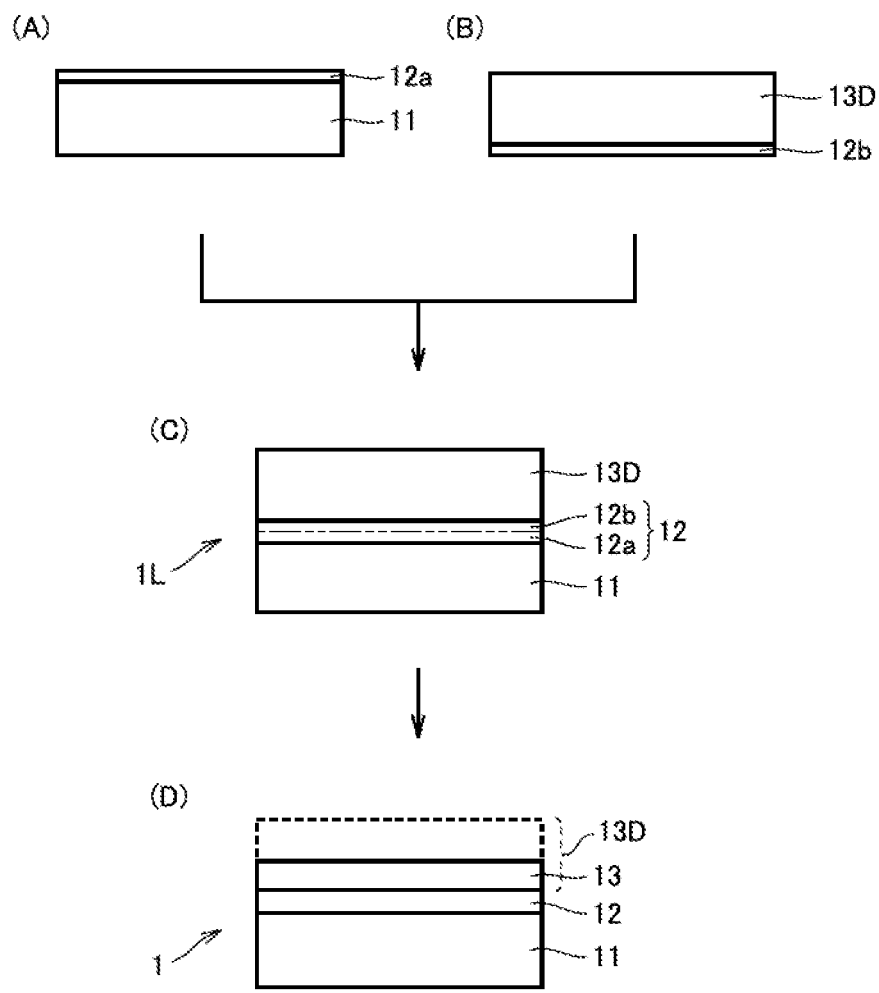
FIG. 12 is a schematic cross-sectional view showing still another example of the method for manufacturing a group III nitride composite substrate according to the present invention.

Referring to FIG. 12, a method for manufacturing group III nitride composite substrate 1 in a still further embodiment of the present invention is a method for manufacturing group III nitride composite substrate 1 of Embodiment 1, including the steps of forming joined substrate 1L with a diameter of 75 mm or more by bonding support substrate 11 and group III nitride film donor substrate 13D to each other (FIG. 12 (A) to (C)); and forming group III nitride composite substrate 1 by performing at least one of grinding, polishing, and etching on a main surface of group III nitride film donor substrate 13D of joined substrate 1L, the main surface being located opposite to a bonded main surface of group III nitride film donor substrate 13D (FIG. 12 (D)).

The method for manufacturing group III nitride composite substrate 1 of the present embodiment enables low-cost and large-diameter group III nitride composite substrate 1 having a group III nitride film with a large thickness and a high crystal quality to be efficiently manufactured.

Regarding the method for manufacturing group III nitride composite substrate 1 in the present embodiment, at least one of grinding, polishing, and etching is performed on the main surface opposite to the bonded main surface of group III nitride film donor substrate 13D to thereby adjust the film thickness by reducing it, and accordingly, group III nitride composite substrate 1 including group III nitride film 13 having a desired thickness of 0.01 mm or more and 0.25 mm or less is obtained.

According to the method for manufacturing group III nitride composite substrate 1 in the present embodiment, in the step of forming a group III nitride composite substrate, at least one of grinding, polishing, and etching is performed on the main surface opposite to the bonded main surface of the group III nitride film donor substrate. Therefore, in order to reduce the material loss of group III nitride film donor substrate 13D, the thickness of group III nitride film donor substrate 13D to be used is preferably 0.5 mm or less, and more preferably 0.4 mm or less.

(Step of Forming Joined Substrate)

Referring to FIG. 12 (A) to (C), the step of forming joined substrate 1L includes, similarly to the method for manufacturing group III nitride composite substrate 1 in Embodiment 4-1: the sub step of forming joint film 12a on a main surface of support substrate 11 (FIG. 12 (A)); the sub step of forming joint film 12b on a main surface of group III nitride film donor substrate 13D (FIG. 12 (B)); and the sub step of bonding joint film 12a formed on support substrate 11 and joint film 12b formed on group III nitride film donor substrate 13D to each other (FIG. 12 (C)).

Here, the sub step of forming joint film 12a on the main surface of support substrate 11 as shown in FIG. 12 (A) is similar to the sub step of forming joint film 12a on the main surface of support substrate 11 as shown in FIG. 10 (A). The sub step of forming joint film 12b on the main surface of group III nitride film donor substrate 13D as shown in FIG. 12 (B) is similar to the sub step of forming joint film 12b on the main surface of group III nitride film donor substrate 13D as shown in FIG. 10 (B). The sub step of bonding joint film 12a formed on support substrate 11 and joint film 12b formed on group III nitride film donor substrate 13D to each other as shown in FIG. 12 (C) is similar to the sub step of bonding joint film 12a formed on support substrate 11 and joint film 12b formed on group III nitride film donor substrate 13D to each other as shown in FIG. 10 (C). Therefore, the description of them will not be repeated.

(Step of Forming Group III Nitride Composite Substrate)

Referring to FIG. 12 (D), in the step of forming group III nitride composite substrate 1, at least one of grinding, polishing, and etching is performed on a main surface opposite to a bonded main surface of group III nitride film donor substrate 13D in joined substrate 1L, to thereby form group III nitride film 13 with its thickness reduced, from group III nitride film donor substrate 13D, and accordingly form group III nitride composite substrate 1 in which support substrate 11 and group III nitride film 13 are bonded together with joint film 12 interposed therebetween.

The method for grinding group III nitride film donor substrate 13D is not particularly limited, and may be grinding by means of one of a grinding wheel and abrasive grains. The method for polishing group III nitride film donor substrate 13D is not particularly limited, and may be rough polishing such as mechanical polishing, precision polishing such as CMP and chemical polishing, or the like. The method for etching group III nitride film donor substrate 13D is not particularly limited, and may be wet etching using a chemical solution, dry etching such as RIE (reactive ion etching), or the like.

In order to remove a damaged layer of group III nitride film 13 as formed to thereby keep the crystal quality high and to smooth the main surface, it is preferable to polish the main surface of group III nitride film 13 of group III nitride composite substrate 1 obtained through at least one of grinding and etching. The reduction of the thickness by at least one of grinding, polishing, and etching is preferably 0.01 mm or more, more preferably 0.02 mm or more, and still more preferably 0.03 mm or more, in order to remove a damaged layer. Meanwhile, the reduction of the thickness by at least one of grinding, polishing, and etching is preferably 0.1 mm or less, more preferably 0.08 mm or less, and still more preferably 0.06 mm or less, in order to reduce the material loss of group III nitride film donor substrate 13D.

Embodiment 5

Method for Manufacturing Group III Nitride Semiconductor Device

Figure 14:
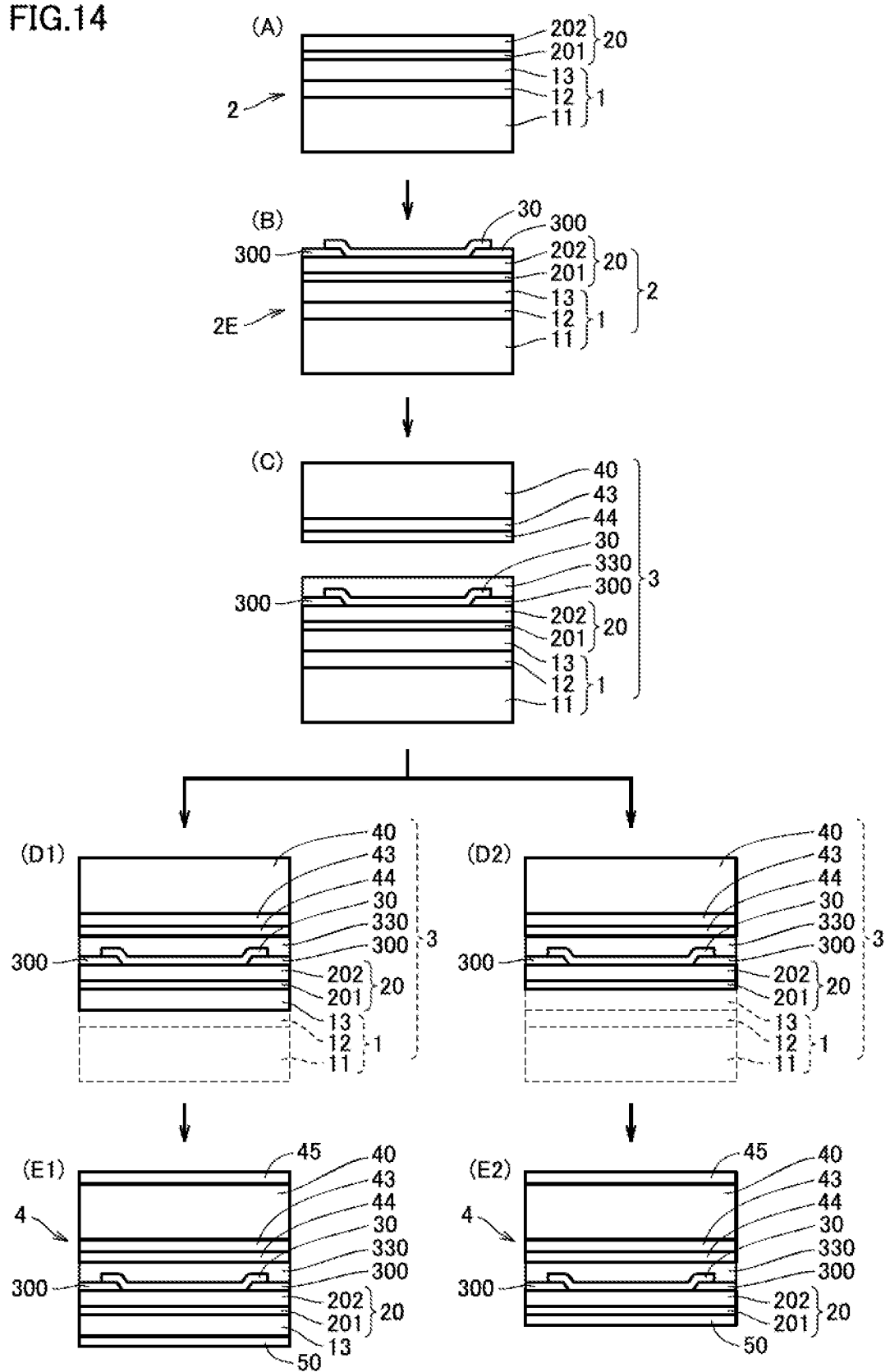
FIG. 14 is a schematic cross-sectional view showing an example of the method for manufacturing a group III nitride semiconductor device according to the present invention.
Figure 15:
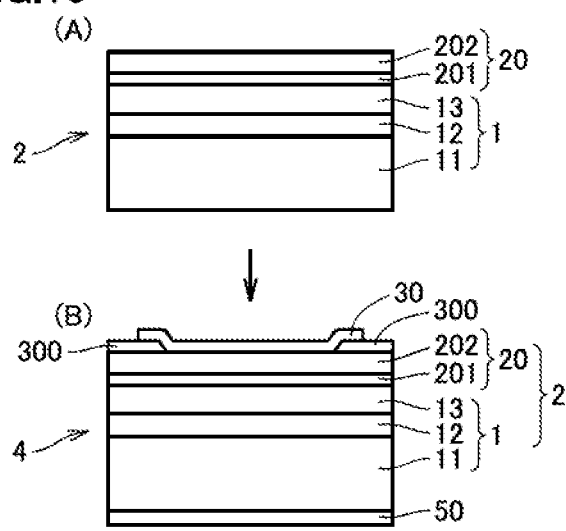
FIG. 15 is a schematic cross-sectional view showing another example of the method for manufacturing a group III nitride semiconductor device according to the present invention.
Figure 16:
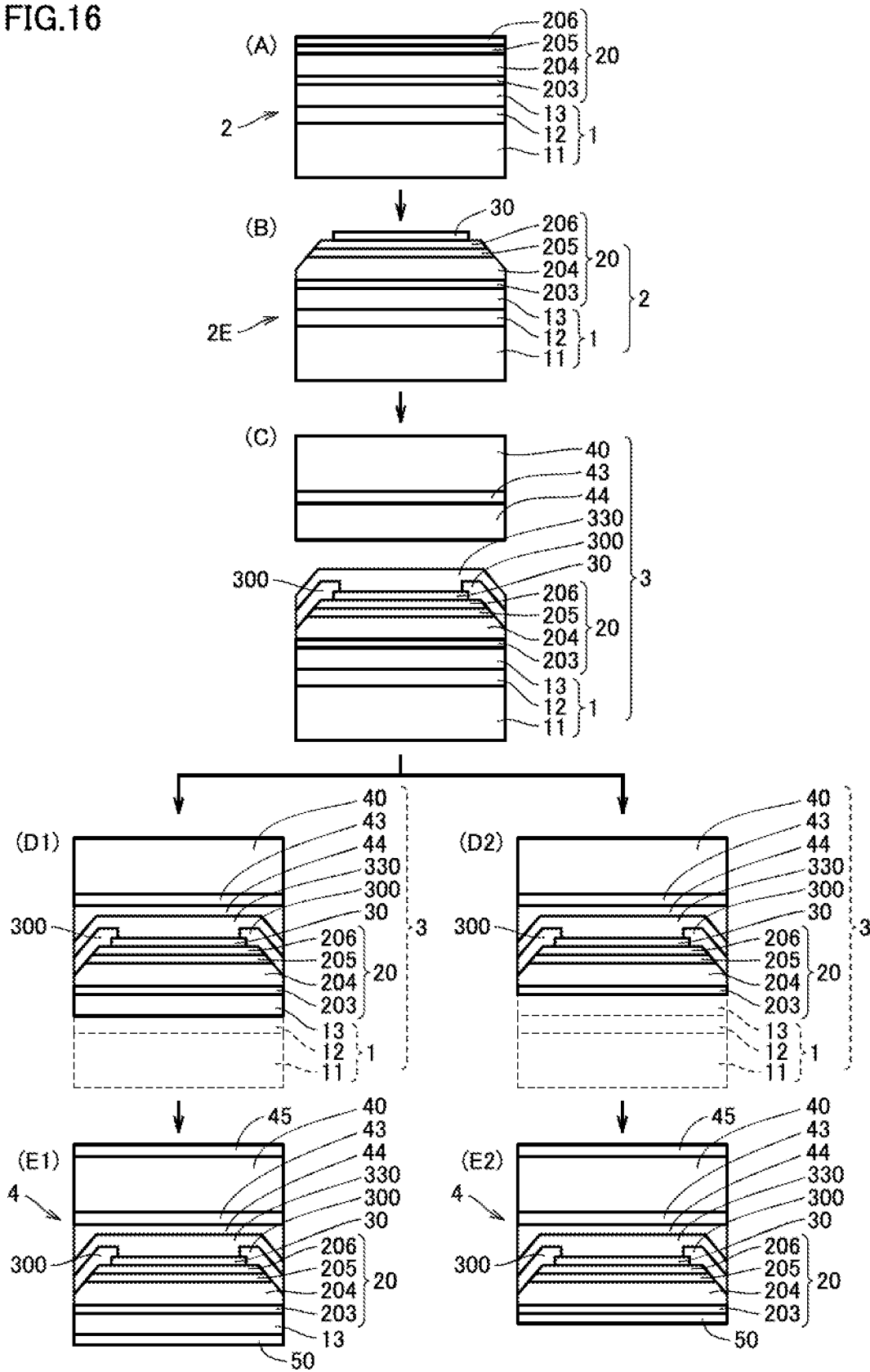
FIG. 16 is a schematic cross-sectional view showing still another example of the method for manufacturing a group III nitride semiconductor device according to the present invention.
Figure 17:
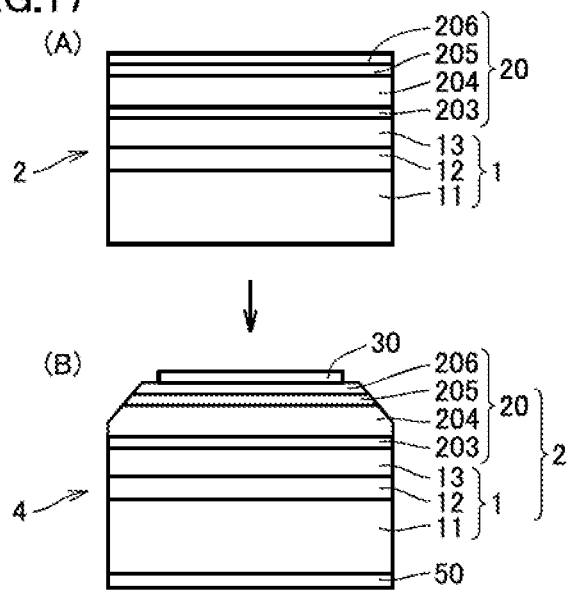
FIG. 17 is a schematic cross-sectional view showing a further example of the method for manufacturing a group III nitride semiconductor device according to the present invention.

Referring to FIGS. 14 to 17, a method for manufacturing group III nitride semiconductor device 4 in a still further embodiment of the present invention includes the steps of: preparing group III nitride composite substrate 1 of Embodiment 1; and growing at least one group III nitride layer 20 on group III nitride film 13 of group III nitride composite substrate 1 (FIG. 14 (A), FIG. 15 (A), FIG. 16 (A), and FIG. 17 (A)). The method for manufacturing group III nitride semiconductor device 4 of the present embodiment enables group III nitride semiconductor devices having excellent characteristics to be manufactured with a high yield.

The method for manufacturing group III nitride semiconductor device 4 in the present embodiment may further include the steps of: further bonding device support substrate 40 onto group III nitride layer 20 (FIG. 14 (C) and FIG. 16 (C)); and removing support substrate 11 from group III nitride composite substrate 1 (FIG. 14 (D1) or (D2) and FIG. 16 (D1) or (D2)). These steps can be added to manufacture, with a high yield, group III nitride semiconductor devices supported by device support substrate 40 and having a high mechanical strength and excellent characteristics.

The method for manufacturing group III nitride semiconductor device 4 in the present embodiment may specifically be performed through the following steps.

(Step of Growing Group III Nitride Layer)

Referring to FIG. 14 (A), FIG. 15 (A), FIG. 16 (A), and FIG. 17 (A), in the step of growing at least one group III nitride layer 20 on group III nitride film 13 of group III nitride composite substrate 1, suitable methods for growing group III nitride layer 20 are gas phase methods such as MOVPE, MBE, HVPE, and sublimation method, as well as liquid phase methods such as flux method, in order to epitaxially grow group III nitride layer 20 having a high crystal quality, and a particularly suitable method is MOVPE.

The configuration of group III nitride layer 20 varies depending on the type of group III nitride semiconductor device 4. Referring to FIGS. 14 and 15, in the case where group III nitride semiconductor device 4 is an SBD (schottky barrier diode), group III nitride layer 20 may be configured for example by successively growing, on group III nitride film 13, an $n^+$-GaN layer 201 (having a carrier concentration of $2 \times 10^{18}$ cm$^{-3}$ for example) and an $n^-$-GaN layer 202 (having a carrier concentration of $1 \times 10^{16}$ cm$^{-3}$ for example).

Referring to FIGS. 16 and 17, in the case where group III nitride semiconductor device 4 is a PND (pn junction diode), group III nitride layer 20 may be configured for example by successively growing, on group III nitride film 13, an $n^+$-GaN layer 203 (having a carrier concentration of $2 \times 10^{18}$ cm$^{-3}$ for example), an $n^-$-GaN layer 204 (having a carrier concentration of $1 \times 10^{16}$ cm$^{-3}$ for example), a $p^-$-GaN layer 205 (having an Mg concentration of $5\times10^{17}$ cm$^{-3}$ for example), and a p$^+$-GaN layer 206 (having an Mg concentration of $1\times10^{20}$ cm$^{-3}$ for example).

In this way, at least one group III nitride layer 20 is grown on group III nitride film 13 of group III nitride composite substrate 1, and accordingly laminated group III nitride composite substrate 2 is obtained.

{In the Case of Manufacture of Group III Nitride Semiconductor Device Including Support Substrate}

Referring to FIGS. 15 and 17, in the case of manufacture of group III nitride semiconductor device 4 of the third type including support substrate 11, the method for manufacturing group III nitride semiconductor device 4 in the present embodiment preferably includes, for the sake of efficient manufacture, the steps of: growing at least one group III nitride layer 20 on group III nitride film 13 of group III nitride composite substrate 1 as described above; and the step of producing an electrode as described below. In the case of manufacture of group III nitride semiconductor device 4 including support substrate 11, the device support substrate is unnecessary and therefore, the step of bonding device support substrate 40 as shown in FIGS. 14 and 16 may not be included.

(Step of Forming Electrode)

Referring to FIG. 15 (B), in the case where an SBD is manufactured as group III nitride semiconductor device 4, an insulating film 300 having an opening and a schottky electrode as first electrode 30 are formed on the n$^-$-GaN layer 202 side of group III nitride layer 20, and an ohmic electrode as second electrode 50 is formed on support substrate 11 on the n$^+$-GaN layer 201 side of group III nitride layer 20, for example. Referring further to FIG. 17 (B), in the case where a PND is manufactured as group III nitride semiconductor device 4, a mesa portion is formed as a part of group III nitride layer 20, an ohmic electrode as first electrode 30 is formed on the p$^+$-GaN layer 206 side of group III nitride layer 20, and an ohmic electrode as second electrode 50 is formed on support substrate 11 on the n$^+$-GaN layer 203 side of group III nitride layer 20. These methods for forming an electrode are not particularly limited as long as the methods are suitable for the material of the electrode to be formed, and vacuum vapor deposition, sputtering, or the like is used.

{In the Case of Manufacture of Group III Nitride Semiconductor Device Including Device Support Substrate}

Referring to FIGS. 14 and 16, in the case of manufacture of group III nitride semiconductor device 4 including device support substrate 40, preferably the method further includes, for the sake of efficient manufacture, the steps of: further bonding device support substrate 40 onto group III nitride layer 20 (FIG. 14 (B) and (C) and FIGS. 16 (B) and (C)); and removing support substrate 11 from group III nitride composite substrate 1 (FIG. 14 (D1) and (D2) and FIG. 16 (D1) and (D2)).

(Step of Bonding Device Support Substrate)

Referring to FIGS. 14 (B) and (C), in the case where an SBD is manufactured as group III nitride semiconductor device 4, the step of further bonding device support substrate 40 onto group III nitride layer 20 is performed by: forming an insulating film 300 having an opening on group III nitride layer 20 of laminated group III nitride composite substrate 2; forming a schottky electrode as first electrode 30 on a part of insulating film 300 and on group III nitride layer 20 under the opening of insulating film 300 to thereby form an electrode-attached laminated group III nitride composite substrate 2E; thereafter forming a barrier film 330 on first electrode 30 and on a part of insulating film 300 where first electrode 30 of electrode-attached laminated group III nitride composite substrate 2E is not formed; forming a pad electrode 43 and a joint metal film 44 on device support substrate 40; and bonding joint metal film 44 to barrier film 330.

Referring to FIGS. 16 (B) and (C), in the case where a PND is manufactured as group III nitride semiconductor device 4, the step of further bonding device support substrate 40 onto group III nitride layer 20 is performed by: forming a mesa portion as a part of group III nitride layer 20; forming first electrode 30 on group III nitride layer 20 to thereby form an electrode-attached laminated group III nitride composite substrate 2E; thereafter forming an insulating film 300 on a part of first electrode 30 of this electrode-attached laminated group III nitride composite substrate 2E and on a leg portion of the mesa portion of group III nitride layer 20; forming a barrier film 330 on first electrode 30 and on insulating film 300; forming a pad electrode 43 and a joint metal film 44 on device support substrate 40; and bonding joint metal film 44 to barrier film 330. This step of bonding device support substrate 40 is performed to thereby obtain a laminated substrate 3.

(Step of Removing Support Substrate)

Referring to FIG. 14 (D1) and FIG. 16 (D1), the step of removing support substrate 11 from group III nitride composite substrate 1 is performed by removing support substrate 11 of group III nitride composite substrate 1 from laminated substrate 3. In the case where group III nitride composite substrate 1 includes joint film 12 interposed between support substrate 11 and group III nitride film 13, joint film 12 can also be removed. Referring further to FIG. 14 (D2) and FIG. 16 (D2), group III nitride film 13 can also be removed in addition to support substrate 11 and joint film 12. If group III nitride film 13 of group III nitride composite substrate 1 is damaged, the damaged group III nitride film 13 can be removed to thereby obtain group III nitride semiconductor device 4 having excellent characteristics.

Here, the method for removing support substrate 11, joint film 12 and/or group III nitride film 13 is not particularly limited, and suitable methods to be used are grinding, polishing, etching, and the like. For example, support substrate 11 formed of a material which is low in hardness, strength, and wear resistance, and is likely to be ground off, can be removed by at least one of grinding and polishing, in order to reduce the manufacturing cost. Support substrate 11 formed of a material which can be dissolved in a chemical solution such as acid solution or alkali solution, can be removed through etching with a chemical solution, since it requires low manufacturing cost. As support substrate 11, a support substrate formed of a polycrystalline material such as ceramic material is more preferred as compared with a support substrate formed of a monocrystalline material such as sapphire, SiC, group III nitride (GaN for example), or the like, since the support substrate 11 of the polycrystalline material is easier to remove.

(Step of Forming Electrode)

Referring to FIG. 14 (E1) and FIG. 16 (E1), on group III nitride film 13 exposed by removal of support substrate 11 and joint film 12 from laminated substrate 3, a second electrode 50 is formed and, on device support substrate 40, a device support substrate electrode 45 is formed. Alternatively, referring to FIG. 14 (E2) and FIG. 16 (E2), on group III nitride layer 20 exposed by removal of support substrate 11, joint film 12, and group III nitride film 13 from laminated substrate 3, second electrode 50 is formed and, on device support substrate 40, device support substrate electrode 45 is formed.

EXAMPLES

Example A

1. Fabrication of Group III Nitride Composite Substrate

Referring to FIG. 10 (A), support substrates 11 with a diameter of 75 mm and a thickness of 0.5 mm formed respectively of the materials indicated in Table 1 as those of Example A1 to Example A12 were prepared. The materials for support substrates 11 of respective Examples were as follows. Example A1 was mullite where $Al_2O_3$ was 60 mol % and $SiO_2$ was 40 mol % relative to the whole substrate, Example A2 was sapphire, Example A3 was alumina, Example A4 was $SiO_2$ glass, Example A5 was an $Al_2O_3$—$SiO_2$ composite oxide where $Al_2O_3$ was 85 mass % and $SiO_2$ was 15 mass % relative to the whole substrate, Example A6 was mullite-YSZ where mullite was 70 mass % and YSZ (yttria stabilized zirconia) was 30 mass % relative to the whole substrate, $Al_2O_3$ was 60 mol % and $SiO_2$ was 40 mol % relative to mullite, and $ZrO_2$ was 90 mol % and $Y_2O_3$ was 10 mol % relative to YSZ, Example A7 was SiC sintered body, Example A8 was Si, Example A9 was SiC single crystal, Example A10 was AlN, Example A11 was $Si_3N_4$, and Example A12 was $ZrO_2$.

Both main surfaces of prepared support substrate 11 were subjected to rough polishing by means of diamond abrasive grains and a copper-based surface plate, intermediate polishing by means of diamond abrasive grains and a tin surface plate, and finish polishing by means of a nonwoven polishing pad so that the surfaces were mirror-finished to have an RMS (root mean square roughness) of 5 nm or less. After this, an $SiO_2$ film was grown on this to a thickness of 800 nm by the LP-CVD (Low Pressure-Chemical Vapor Deposition) method. Then, CMP (chemical mechanical polishing) was performed using a slurry having a pH of 10 and containing colloidal silica abrasive grains having an average grain size of 40 nm, to thereby form joint film 12a having a thickness of 400 nm and planarized so that the RMS of the main surface was 0.3 nm or less. In order to remove abrasive grains used for CMP, non-abrasive polishing cleaning with a KOH aqueous solution and cleaning with pure water were performed.

Referring to FIG. 10 (B), a GaN crystal body having a diameter of 75 mm and a thickness of 8 mm was prepared for use as group III nitride film donor substrate 13D. A surface-to-be-bonded of group III nitride film donor substrate 13D was subjected to mechanical polishing and CMP so that it was mirror-finished to have an RMS of 2 nm or less. After this, an $SiO_2$ film having a thickness of 800 nm was grown by the LP-CVD (Low Pressure-Chemical Vapor Deposition) method on the surface-to-be-bonded, and CMP was performed using a slurry having a pH of 10 and containing colloidal silica abrasive grains having an average grain size of 40 nm, to thereby form joint film 12b having a thickness of 500 nm and having a main surface planarized to have an RMS of 0.3 nm or less. In order to remove abrasive grains used for CMP, non-abrasive polishing cleaning with a KOH aqueous solution and cleaning with pure water were performed. Here, group III nitride film donor substrate 13D was produced through growth by the HVPE method using a GaAs substrate as a base substrate.

Referring to FIG. 10 (C), joint film 12a and joint film 12b were bonded together to thereby produce joined substrate 1L in which support substrate 11 and group III nitride film 13 were bonded to each other with joint film 12 interposed therebetween. After they were bonded together, joined substrate 1L was annealed by being heated in a nitrogen gas atmosphere to 800° C., to thereby increase the joint strength.

Referring to FIG. 10 (D), group III nitride film donor substrate 13D of joined substrate 1L was cut, with a wire saw, along a plane located inwardly at a depth of 0.15 mm from the bonded surface, namely the surface of group III nitride film donor substrate 13D bonded to joint film 12, to thereby produce group III nitride composite substrate 1 in which support substrate 11 and the GaN film which was group III nitride film 13 were bonded together with joint film 12 interposed therebetween. As the wire, a fixed-abrasive wire on which diamond abrasive grains were electrodeposited was used. As for the cutting method, in order to reduce the cut resistance and enhance the thickness precision and the flatness, the method was used that caused the wire to swing and caused group III nitride film donor substrate 13D to vibrate in synchronization therewith. The resistance coefficient for cutting with the wire saw was set to 4200 N. After cutting, group III nitride film 13 of group III nitride composite substrate 1 was subjected to mechanical polishing and CMP. In order to have a uniform thickness of group III nitride film 13, group III nitride composite substrate 1 was mounted on a CMP apparatus in the following way. The shape of the substrate was corrected in advance by vacuum chuck suction, and thereafter the composite substrate was suction-fixed onto the apparatus. In this way, group III nitride composite substrate 1 having a diameter of 75 mm was obtained in which group III nitride film 13 having a thickness of 0.05 mm was bonded onto support substrate 11 having a thickness of 0.5 mm with a joint film having a thickness of 900 nm interposed therebetween.

Regarding group III nitride composite substrate 1 thus obtained, the items summarized in Table 1 are: the name of the material, Young's modulus $E_s$ (unit: GPa), thermal expansion coefficient $\alpha_s$ (unit: $\times 10^{-6}$ $K^{-1}$), thermal conductivity ($W \cdot m^{-1} \cdot K^{-1}$), and thickness $t_s$ (unit: mm) of support substrate 11; the name of the material, Young's modulus $E_f$ (unit: GPa), thermal expansion coefficient $\alpha_f$ (unit: $\times 10^{-6}$ $K^{-1}$), and thickness $t_f$ (unit: mm) of group III nitride film 13; and difference $\Delta\alpha$ (unit: $\times 10^{-6}$ $K^{-1}$) in thermal expansion coefficient determined by subtracting thermal expansion coefficient $\alpha_s$ from thermal expansion coefficient Oar, Young's modulus ratio $E_f/E_s$ (unit: dimensionless) of Young's modulus $E_f$ to Young's modulus $E_s$, and the diameter, as well as parameter X, namely $E_f|\Delta\alpha|/E_s$ (unit: $\times 10^{-6}$ $K^{-1}$), parameter Y, namely $t_s^2/t_f$ (unit: mm), and parameter Y/X, of group III nitride composite substrate 1.

2. Growth of Group III Nitride Layer

Referring to FIG. 2, on group III nitride film 13 of group III nitride composite substrate 1, MOVPE was applied to grow group III nitride layer 20, specifically to epitaxially grow $n^+$-GaN layer 201 serving as a carrier stop layer and having a carrier concentration of $2 \times 10^{18}$ $cm^{-3}$ and a thickness of 1 μm and $n^-$-GaN layer 202 serving as a carrier drift layer and having a carrier concentration of $\times 10^{16}$ $cm^{-3}$ and a thickness of 5 μm in this order, and thereby obtain laminated group III nitride composite substrate 2. Here, the growth temperature of group III nitride layer 20 was 1050° C., TMG (trimethylgallium) and $NH_3$ were used as materials for GaN, and $SiH_4$ was used as a material for Si dopant.

The appearance of laminated group III nitride composite substrate 2 after the epitaxial growth of group III nitride layer 20 was observed. The results are summarized in Table 1.

Next, for all Examples except for Example A4, the distribution, in a plane parallel to a main surface, of the carrier concentration in the carrier drift layer of group III nitride layer 20 in laminated group III nitride composite substrate 2 was measured by means of the CV measurement method. A CV measurement pattern was formed through photolithography, EB (electron beam) vapor deposition of an Ni/Au electrode (an Ni layer having a thickness of 50 nm and an Au layer having a thickness of 300 nm), and lift-off, in such a manner that schottky electrodes having a diameter of 0.2 mm were arranged at square lattice points at a pitch of 5 mm over the entire surface of the carrier drift layer. Regarding the CV measurement, at 25 points except for the points located within 5 mm from the perimeter, among the points arranged at a pitch of 5 mm in a cross-shape region, the carrier concentrations at respective points were measured, and the average and the standard deviation within the plane were calculated. Here, the standard deviation is a positive square root of the unbiased variance. An example having a standard deviation within the plane of $2.5 \times 10^{15}$ cm$^{-3}$ or less was evaluated as having a satisfactory in-plane uniformity, while an example having a standard deviation within the plane of more than $2.5 \times 10^{15}$ cm$^{-3}$ was evaluated as having an unsatisfactory in-plane uniformity. The results are summarized in Table 1.

TABLE 1

| | | Examples | | | | | |
|---|---|---|---|---|---|---|---|
| | | A1 | A2 | A3 | A4 | A5 | A6 |
| support substrate | material | mullite | sapphire | alumina | SiO$_2$ glass | Al$_2$O$_3$—SiO$_2$ | mullite-YSZ |
| | Young's modulus E$_s$ (GPa) | 200 | 470 | 360 | 70 | 250 | 150 |
| | thermal expansion coefficient α$_s$ ($\times 10^{-6}$K$^{-1}$) | 5.1 | 7.0 | 7.2 | 0.5 | 6.2 | 5.8 |
| | thermal conductivity (W·m$^{-1}$·K$^{-1}$) | 5 | 40 | 30 | 1.5 | 25 | 5 |
| | thickness t$_s$ (mm) | 0.5 | 0.5 | 0.5 | 0.5 | 0.5 | 0.5 |
| group III nitride film | material | GaN | GaN | GaN | GaN | GaN | GaN |
| | Young's modulus E$_f$(GPa) | 150 | 150 | 150 | 150 | 150 | 150 |
| | thermal expansion coefficient α$_f$ ($\times 10^{-6}$K$^{-1}$) | 5.9 | 5.9 | 5.9 | 5.9 | 5.9 | 5.9 |
| | thickness t$_f$(mm) | 0.05 | 0.05 | 0.05 | 0.05 | 0.05 | 0.05 |
| group III nitride composite substrate | thermal expansion coefficient difference Δα | 0.8 | −1.1 | −1.3 | 5.4 | −0.3 | 0.1 |
| | Young's modulus ratio E$_f$/E$_s$ | 0.75 | 0.32 | 0.42 | 2.14 | 0.60 | 1.00 |
| | diameter (mm) | 75 | 75 | 75 | 75 | 75 | 75 |
| | E$_f$·|Δα|/E$_s$ ($\times 10^{-6}$K$^{-1}$) [parameter X] | 0.600 | 0.351 | 0.542 | 11.571 | 0.180 | 0.100 |
| | t$_s^2$/t$_f$(mm) [parameter Y] | 5.0 | 5.0 | 5.0 | 5.0 | 5.0 | 5.0 |
| | parameter Y/X | 8.33 | 14.2 | 9.23 | 0.432 | 27.8 | 50.0 |
| laminated group III nitride composite substrate | appearance evaluation | satisfactory | satisfactory | satisfactory | unsatisfactory | satisfactory | satisfactory |
| | in-plane average of carrier concentration ($\times 10^{15}$ cm$^{-3}$) | 8.7 | 9.2 | 9.2 | 8.7 | 9.1 | 8.9 |
| | in-plane standard deviation of carrier concentration ($\times 10^{15}$ cm$^{-3}$) | 2.0 | 2.0 | 2.0 | 5.0 | 1.5 | 1.0 |
| | evaluation of in-plane uniformity of carrier concentration | satisfactory | satisfactory | satisfactory | — | satisfactory | satisfactory |

| | | Examples | | | | | |
|---|---|---|---|---|---|---|---|
| | | A7 | A8 | A9 | A10 | A11 | A12 |
| support substrate | material | SiC sintered | Si | SiC single crystal | AlN | Si$_3$N$_4$ | ZrO$_2$ |
| | Young's modulus E$_s$ (GPa) | 440 | 185 | 450 | 320 | 440 | 200 |
| | thermal expansion coefficient α$_s$ ($\times 10^{-6}$K$^{-1}$) | 3.7 | 2.6 | 4.2 | 4.6 | 2.8 | 10 |
| | thermal conductivity (W·m$^{-1}$·K$^{-1}$) | 200 | 150 | 400 | 150 | 27 | 3 |
| | thickness t$_s$ (mm) | 0.5 | 0.5 | 0.5 | 0.5 | 0.5 | 0.5 |
| group III nitride film | material | GaN | GaN | GaN | GaN | GaN | GaN |
| | Young's modulus E$_f$(GPa) | 150 | 150 | 150 | 150 | 150 | 150 |
| | thermal expansion coefficient α$_f$ ($\times 10^{-6}$K$^{-1}$) | 5.9 | 5.9 | 5.9 | 5.9 | 5.9 | 5.9 |
| | thickness t$_f$(mm) | 0.05 | 0.05 | 0.05 | 0.05 | 0.05 | 0.05 |
| group III nitride composite substrate | thermal expansion coefficient difference Δα | 2.2 | 3.3 | 1.7 | 1.3 | 3.1 | −4.1 |
| | Young's modulus ratio E$_f$/E$_s$ | 0.34 | 0.81 | 0.33 | 0.47 | 0.34 | 0.75 |
| | diameter (mm) | 75 | 75 | 75 | 75 | 75 | 75 |
| | E$_f$·|Δα|/E$_s$ ($\times 10^{-6}$K$^{-1}$) [parameter X] | 0.750 | 2.676 | 0.567 | 0.609 | 1.057 | 3.075 |
| | t$_s^2$/t$_f$(mm) [parameter Y] | 5.0 | 5.0 | 5.0 | 5.0 | 5.0 | 5.0 |
| | parameter Y/X | 6.67 | 1.87 | 8.82 | 8.21 | 4.73 | 1.63 |

TABLE 1-continued

| laminated group III nitride composite substrate | appearance evaluation | satisfactory | unsatisfactory | satisfactory | satisfactory | unsatisfactory | unsatisfactory |
|---|---|---|---|---|---|---|---|
| | in-plane average of carrier concentration ($\times 10^{15}$ cm$^{-3}$) | 9.3 | 9.1 | 9.2 | 9.2 | 8.9 | 9.1 |
| | in-plane standard deviation of carrier concentration ($\times 10^{15}$ cm$^{-3}$) | 2.5 | 5.0 | 2.0 | 2.1 | 2.9 | 5.0 |
| | evaluation of in-plane uniformity of carrier concentration | satisfactory | unsatisfactory | satisfactory | satisfactory | unsatisfactory | unsatisfactory |

Referring to Table 1, as to Example A4 where the SiO$_2$ glass substrate was used as the support substrate, the group III nitride film and the group III nitride layer of the laminated group III nitride composite substrate, in which the group III nitride layer was grown on the group III nitride film of the group III nitride composite substrate, peeled off from the support substrate, resulting in an unsatisfactory appearance. As to Examples A8, A11, and A12 each where the Si substrate, the Si$_3$N$_4$ substrate, or the ZrO$_2$ substrate was used as the support substrate, crack occurred to the group III nitride film and the group III nitride layer, resulting in an unsatisfactory appearance. As to Examples A1 to A3, A5 to A7, A9, and A10, no crack and no peeling occurred to the group III nitride film and the group III nitride layer, presenting a satisfactory appearance.

Within a plane parallel to a main surface, the uniformity of the carrier concentration in the carrier drift layer of the group III nitride layer in the laminated group III nitride composite substrate was unsatisfactory in Examples A8, A11, and A12, and satisfactory in Examples A1 to A3, A5 to A7, A9, and A10.

There was a tendency that an example where the appearance of the laminated group III nitride composite substrate and the in-plane uniformity of the carrier concentration in the carrier drift layer of the group III nitride layer were unsatisfactory had a relatively large absolute value of the difference $\Delta\alpha$ in thermal expansion coefficient between the support substrate and the group III nitride film, while an example where the appearance of the laminated group III nitride composite substrate and the in-plane uniformity of the carrier concentration in the carrier drift layer of the group III nitride layer were satisfactory had a relatively small absolute value of the difference $\Delta\alpha$ in thermal expansion coefficient between the support substrate and the group III nitride film. It should be noted that the degree of this tendency varied depending on the type of the material for the support substrate.

Example B

Group III nitride composite substrates were fabricated similarly to Example A, except that the group III nitride composite substrates were fabricated in which the support substrate was made of the SiC sintered body and respective support substrates and respective group III nitride films were different from each other in terms of the thickness as seen from Examples B1 to B7 in Table 2, and the group III nitride layer was grown on the group III nitride film of the group III nitride composite substrate to thereby fabricate the laminated group III nitride composite substrate. Further, the appearance of the laminated group III nitride composite substrate thus fabricated and the in-plane uniformity of the carrier concentration were evaluated. The results are summarized in Table 2.

TABLE 2

| | | Examples | | | | | | |
|---|---|---|---|---|---|---|---|---|
| | | B1 | B2 | B3 | B4 | B5 | B6 | B7 |
| support substrate | material | SiC sintered | SiC sintered | SiC sintered | SiC sintered | SiC sintered | SiC sintered | SiC sintered |
| | Young's modulus $E_s$ (GPa) | 440 | 440 | 440 | 440 | 440 | 440 | 440 |
| | thermal expansion coefficient $\alpha_s$ ($\times 10^{-6}$K$^{-1}$) | 3.7 | 3.7 | 3.7 | 3.7 | 3.7 | 3.7 | 3.7 |
| | thermal conductivity (W·m$^{-1}$·K$^{-1}$) | 200 | 200 | 200 | 200 | 200 | 200 | 200 |
| | thickness $t_s$ (mm) | 0.5 | 0.4 | 0.3 | 0.5 | 1 | 1 | 1 |
| group III nitride film | material | GaN | GaN | GaN | GaN | GaN | GaN | GaN |
| | Young's modulus $E_f$ (GPa) | 150 | 150 | 150 | 150 | 150 | 150 | 150 |
| | thermal expansion coefficient $\alpha_f$ ($\times 10^{-6}$K$^{-1}$) | 5.9 | 5.9 | 5.9 | 5.9 | 5.9 | 5.9 | 5.9 |
| | thickness $t_f$ (mm) | 0.05 | 0.05 | 0.05 | 0.1 | 0.1 | 0.2 | 0.25 |
| group III nitride composite substrate | thermal expansion coefficient difference $\Delta\alpha$ | 2.2 | 2.2 | 2.2 | 2.2 | 2.2 | 2.2 | 2.2 |
| | Young's modulus ratio $E_f/E_s$ | 0.34 | 0.34 | 0.34 | 0.34 | 0.34 | 0.34 | 0.34 |
| | diameter (mm) | 75 | 75 | 75 | 75 | 75 | 75 | 75 |
| | $E_f \cdot |\Delta\alpha|/E_s$ ($\times 10^{-6}$K$^{-1}$) [parameter X] | 0.750 | 0.750 | 0.750 | 0.750 | 0.750 | 0.750 | 0.750 |
| | $t_s^2/t_f$ (mm) [parameter Y] | 5.0 | 3.2 | 1.8 | 2.5 | 10 | 5.0 | 4.0 |
| | parameter Y/X | 6.67 | 4.27 | 2.40 | 3.33 | 13.3 | 6.67 | 5.33 |

TABLE 2-continued

|  |  | Examples | | | | | | |
|---|---|---|---|---|---|---|---|---|
|  |  | B1 | B2 | B3 | B4 | B5 | B6 | B7 |
| laminated group III nitride composite substrate | appearance evaluation | satisfactory | satisfactory | satisfactory | satisfactory | satisfactory | satisfactory | satisfactory |
|  | in-plane average of carrier concentration ($\times 10^{15}$ cm$^{-3}$) | 8.7 | 9.2 | 9.2 | 9.2 | 9.2 | 9.2 | 9.2 |
|  | in-plane standard deviation of carrier concentration ($\times 10^{15}$ cm$^{-3}$) | 2.1 | 3.2 | 4.3 | 3.3 | 1.7 | 2.4 | 2.6 |
|  | evaluation of in-plane uniformity of carrier concentration | satisfactory | unsatisfactory | unsatisfactory | unsatisfactory | satisfactory | satisfactory | unsatisfactory |

Referring to Table 2, as to all of Examples B1 to B7, no crack and no peeling occurred to the group III nitride film and the group III nitride layer of the laminated group III nitride composite substrate, and thus the appearance was satisfactory. Regarding the uniformity, in a plane parallel to a main surface, of the carrier concentration in the carrier drift layer of the group III nitride layer in the laminated group III nitride composite substrate, Examples B2 and B3 having a small thickness of the support substrate as well as Examples B4 and B7 having a large thickness of the group III nitride film relative to the thickness of the support substrate were unsatisfactory, while Example B1 having a large thickness of the support substrate and a small thickness of the group III nitride film as well as Examples B5 to B6 having a large thickness of the support substrate were satisfactory.

Example C

Group III nitride composite substrates were fabricated similarly to Example A, except that the group III nitride composite substrates were fabricated in which the support substrate was made of Si and respective support substrates and respective group III nitride films were different from each other in terms of the thickness as seen from Examples C1 to C5 in Table 3, and the group III nitride layer was grown on the group III nitride film of the group III nitride composite substrate to thereby fabricate the laminated group III nitride composite substrate. Further, the appearance of the laminated group III nitride composite substrate thus fabricated and the in-plane uniformity of the carrier concentration were evaluated. The results are summarized in Table 3.

TABLE 3

|  |  | Examples | | | | |
|---|---|---|---|---|---|---|
|  |  | C1 | C2 | C3 | C4 | C5 |
| support substrate | material | Si | Si | Si | Si | Si |
|  | Young's modulus $E_s$ (GPa) | 185 | 185 | 185 | 185 | 185 |
|  | thermal expansion coefficient $\alpha_s$ ($\times 10^{-6}$K$^{-1}$) | 2.6 | 2.6 | 2.6 | 2.6 | 2.6 |
|  | thermal conductivity (W · m$^{-1}$ · K$^{-1}$) | 150 | 150 | 150 | 150 | 150 |
|  | thickness $t_s$ (mm) | 0.5 | 0.7 | 0.9 | 0.5 | 0.5 |
| group III nitride film | material | GaN | GaN | GaN | GaN | GaN |
|  | Young's modulus $E_f$ (GPa) | 150 | 150 | 150 | 150 | 150 |
|  | thermal expansion coefficient $\alpha_f$ ($\times 10^{-6}$K$^{-1}$) | 5.9 | 5.9 | 5.9 | 5.9 | 5.9 |
|  | thickness $t_f$ (mm) | 0.05 | 0.05 | 0.05 | 0.02 | 0.01 |
| group III nitride composite substrate | thermal expansion coefficient difference $\Delta\alpha$ | 3.3 | 3.3 | 3.3 | 3.3 | 3.3 |
|  | Young's modulus ratio $E_f/E_s$ | 0.81 | 0.81 | 0.81 | 0.81 | 0.81 |
|  | diameter (mm) | 75 | 75 | 75 | 75 | 75 |
|  | $E_f \cdot |\Delta\alpha|/E_s$ ($\times 10^{-6}$K$^{-1}$) [parameter X] | 2.676 | 2.676 | 2.676 | 2.676 | 2.676 |
|  | $t_s^2/t_f$ (mm) [parameter Y] | 5.0 | 9.8 | 16 | 13 | 25 |
|  | parameter Y/X | 1.87 | 3.66 | 5.98 | 4.86 | 9.34 |
| laminated group III nitride composite substrate | appearance evaluation | unsatisfactory | unsatisfactory | unsatisfactory | unsatisfactory | unsatisfactory |
|  | in-plane average of carrier concentration ($\times 10^{15}$ cm$^{-3}$) | 9.0 | 8.8 | 8.7 | 9.2 | 9.1 |
|  | in-plane standard deviation of carrier concentration ($\times 10^{15}$ cm$^{-3}$) | 4.7 | 3.8 | 2.8 | 3.3 | 2.6 |
|  | evaluation of in-plane uniformity of carrier concentration | unsatisfactory | unsatisfactory | unsatisfactory | unsatisfactory | unsatisfactory |

Referring to Table 3, as to all of Examples C1 to C5, crack occurred to the group III nitride film and the group III nitride layer of the laminated group III nitride composite substrate, and thus the appearance was unsatisfactory. This was considered as being caused by a large difference in thermal expansion coefficient between the support substrate and the group III nitride film. Regarding the uniformity, in a plane parallel to a main surface, of the carrier concentration in the carrier drift layer of the group III nitride layer in the laminated group III nitride composite substrate, all of Examples C1 to C5 suffered from occurrence of an abnormal distribution of the carrier concentration in a peripheral region where the aforementioned crack occurred, and thus had an unsatisfactory uniformity.

Example D

Group III nitride composite substrates were fabricated similarly to Example A, except that the group III nitride composite substrates were fabricated in which the support substrate was made of the $Al_2O_3$—$SiO_2$ composite oxide where $Al_2O_3$ was 85 mass % and $SiO_2$ was 15 mass % relative to the whole substrate, respective support substrates and respective group III nitride films were different from each other in terms of the thickness, and the group III nitride composite substrates were different from each other in terms of the diameter, as seen from Examples D1 to D10 in Table 4, and the group III nitride layer was grown on the group III nitride film of the group III nitride composite substrate to thereby fabricate the laminated group III nitride composite substrate. Further, the appearance of the laminated group III nitride composite substrate thus fabricated and the in-plane uniformity of the carrier concentration were evaluated. The results are summarized in Table 4.

TABLE 4

| | | Examples | | | | |
|---|---|---|---|---|---|---|
| | | D1 | D2 | D3 | D4 | D5 |
| support substrate | material | $Al_2O_3$—$SiO_2$ | $Al_2O_3$—$SiO_2$ | $Al_2O_3$—$SiO_2$ | $Al_2O_3$—$SiO_2$ | $Al_2O_3$—$SiO_2$ |
| | Young's modulus $E_s$ (GPa) | 250 | 250 | 250 | 250 | 250 |
| | thermal expansion coefficient $\alpha_s$ ($\times 10^{-6}K^{-1}$) | 6.2 | 6.2 | 6.2 | 6.2 | 6.2 |
| | thermal conductivity (W·m$^{-1}$·K$^{-1}$) | 25 | 25 | 25 | 25 | 25 |
| | thickness $t_s$ (mm) | 0.5 | 0.7 | 0.2 | 0.5 | 0.5 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ ($\times 10^{-6}K^{-1}$) | 5.9 | 5.9 | 5.9 | 5.9 | 5.9 |
| | thickness $t_f$ (mm) | 0.05 | 0.05 | 0.05 | 0.1 | 0.25 |
| group III nitride composite substrate | thermal expansion coefficient difference $\Delta\alpha$ | −0.3 | −0.3 | −0.3 | −0.3 | −0.3 |
| | Young's modulus ratio $E_f/E_s$ | 0.60 | 0.60 | 0.60 | 0.60 | 0.60 |
| | diameter (mm) | 75 | 75 | 75 | 75 | 75 |
| | $E_f \cdot |\Delta\alpha|/E_s$ ($\times 10^{-6}K^{-1}$) [parameter X] | 0.180 | 0.180 | 0.180 | 0.180 | 0.180 |
| | $t_s^2/t_f$ (mm) [parameter Y] | 5.0 | 9.8 | 0.8 | 2.5 | 1.0 |
| | parameter Y/X | 27.8 | 54.4 | 4.44 | 13.9 | 5.56 |
| laminated group III nitride composite substrate | appearance evaluation | satisfactory | satisfactory | satisfactory | satisfactory | satisfactory |
| | in-plane average of carrier concentration ($\times 10^{15}$ cm$^{-3}$) | 9.2 | 9.0 | 9.3 | 9.1 | 9.0 |
| | in-plane standard deviation of carrier concentration ($\times 10^{15}$ cm$^{-3}$) | 1.5 | 1.3 | 3.0 | 1.7 | 2.6 |
| | evaluation of in-plane uniformity of carrier concentration | satisfactory | satisfactory | unsatisfactory | satisfactory | unsatisfactory |

| | | Examples | | | | |
|---|---|---|---|---|---|---|
| | | D6 | D7 | D8 | D9 | D10 |
| support substrate | material | $Al_2O_3$—$SiO_2$ | $Al_2O_3$—$SiO_2$ | $Al_2O_3$—$SiO_2$ | $Al_2O_3$—$SiO_2$ | $Al_2O_3$—$SiO_2$ |
| | Young's modulus $E_s$ (GPa) | 250 | 250 | 250 | 250 | 250 |
| | thermal expansion coefficient $\alpha_s$ ($\times 10^{-6}K^{-1}$) | 6.2 | 6.2 | 6.2 | 6.2 | 6.2 |
| | thermal conductivity (W·m$^{-1}$·K$^{-1}$) | 25 | 25 | 25 | 25 | 25 |
| | thickness $t_s$ (mm) | 0.3 | 0.5 | 0.5 | 0.5 | 0.5 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ ($\times 10^{-6}K^{-1}$) | 5.9 | 5.9 | 5.9 | 5.9 | 5.9 |
| | thickness $t_f$ (mm) | 0.25 | 0.05 | 0.25 | 0.05 | 0.25 |
| group III nitride composite substrate | thermal expansion coefficient difference $\Delta\alpha$ | −0.3 | −0.3 | −0.3 | −0.3 | −0.3 |
| | Young's modulus ratio $E_f/E_s$ | 0.60 | 0.60 | 0.60 | 0.60 | 0.60 |
| | diameter (mm) | 75 | 100 | 100 | 150 | 150 |
| | $E_f \cdot |\Delta\alpha|/E_s$ ($\times 10^{-6}K^{-1}$) [parameter X] | 0.180 | 0.180 | 0.180 | 0.180 | 0.180 |
| | $t_s^2/t_f$ (mm) [parameter Y] | 0.36 | 5.0 | 1.0 | 5.0 | 1.0 |
| | parameter Y/X | 2.00 | 27.8 | 5.56 | 27.8 | 5.56 |
| laminated group III nitride composite substrate | appearance evaluation | satisfactory | satisfactory | satisfactory | satisfactory | satisfactory |
| | in-plane average of carrier concentration ($\times 10^{15}$ cm$^{-3}$) | 9.2 | 9.1 | 9.0 | 9.0 | 9.1 |
| | in-plane standard deviation of carrier concentration ($\times 10^{15}$ cm$^{-3}$) | 4.4 | 1.7 | 3.2 | 2.0 | 4.6 |
| | evaluation of in-plane uniformity of carrier concentration | unsatisfactory | satisfactory | unsatisfactory | satisfactory | unsatisfactory |

Referring to Table 4, as to all of Examples D1 to D10, no crack and no peeling occurred to the group III nitride film and the group III nitride layer of the laminated group III nitride composite substrate, and thus the appearance was satisfactory. Regarding the uniformity, in a plane parallel to a main surface, of the carrier concentration in the carrier drift layer of the group III nitride layer in the laminated group III nitride composite substrate, Example D3 having a small thickness of the support substrate as well as Examples D5, D6, D8, and D10 having a large thickness of the group III nitride film were unsatisfactory, while Examples D1, D2, D4, D7, and D9 having a large thickness of the support substrate and a small thickness of the group III nitride film were satisfactory.

Example E

The support substrates of respective materials, diameters, and thicknesses indicated for Examples E1 to E11 in Table 5 were prepared. As to the support substrate of each Example, Examples E1, E6, and E9 were each an Mo substrate whose main surface was mirror-finished (with an RMS of 10 nm or less), Examples E2, E7, and E10 were each a W substrate whose main surface was mirror-finished (with an RMS of 10 nm or less), Examples E3, E8, and E11 were each a $ZrB_2$ substrate having a specific resistance of 100 μΩcm, Example E4 was an Si substrate having a specific resistance of 1 mΩcm, and Example E5 was an SiC substrate having a specific resistance of 10 mΩcm. The group III nitride composite substrates were fabricated similarly to Example A except that, on respective main surfaces-to-be-bonded of the support substrate and the group III nitride film donor substrate, sputtering was applied to form, as the joint film, a high-electrical-conductivity $Ga_2O_3$ film having a specific resistance of 10 mΩcm, and the group III nitride layer was grown on the group III nitride film of the group III nitride composite substrate to thereby fabricate the laminated group III nitride composite substrate. Further, the appearance of the laminated group III nitride composite substrate thus fabricated and the in-plane uniformity of the carrier concentration were evaluated. The results are summarized in Table 5.

TABLE 5

| | | Examples | | | | | |
|---|---|---|---|---|---|---|---|
| | | E1 | E2 | E3 | E4 | E5 | E6 |
| support substrate | material | Mo | W | $ZrB_2$ | Si | SiC | Mo |
| | Young's modulus $E_s$ (GPa) | 320 | 380 | 450 | 185 | 450 | 320 |
| | thermal expansion coefficient $\alpha_s$ ($\times 10^{-6} K^{-1}$) | 5.1 | 4.5 | 6.2 | 2.6 | 4.2 | 5.1 |
| | thermal conductivity ($W \cdot m^{-1} \cdot K^{-1}$) | 140 | 170 | 57 | 150 | 400 | 140 |
| | thickness $t_s$ (mm) | 0.5 | 0.5 | 0.5 | 0.5 | 0.5 | 0.6 |
| group III nitride film | material | GaN | GaN | GaN | GaN | GaN | GaN |
| | Young's modulus $E_f$ (GPa) | 150 | 150 | 150 | 150 | 150 | 150 |
| | thermal expansion coefficient $\alpha_f$ ($\times 10^{-6} K^{-1}$) | 5.9 | 5.9 | 5.9 | 5.9 | 5.9 | 5.9 |
| | thickness $t_f$ (mm) | 0.05 | 0.05 | 0.05 | 0.05 | 0.05 | 0.05 |
| group III nitride composite substrate | thermal expansion coefficient difference $\Delta\alpha$ | 0.8 | 1.4 | −0.3 | 3.3 | 1.7 | 0.8 |
| | Young's modulus ratio $E_f/E_s$ | 0.47 | 0.39 | 0.33 | 0.81 | 0.33 | 0.47 |
| | diameter (mm) | 75 | 75 | 75 | 75 | 75 | 100 |
| | $E_f \cdot |\Delta\alpha|/E_s$ ($\times 10^{-6} K^{-1}$) [parameter X] | 0.375 | 0.553 | 0.100 | 2.676 | 0.567 | 0.375 |
| | $t_s^2/t_f$ (mm) [parameter Y] | 5.0 | 5.0 | 5.0 | 5.0 | 5.0 | 7.2 |
| | parameter Y/X | 13.3 | 9.04 | 50.0 | 1.87 | 8.81 | 19.2 |
| laminated group III nitride composite substrate | appearance evaluation | satisfactory | satisfactory | satisfactory | unsatisfactory | satisfactory | satisfactory |
| | in-plane average of carrier concentration ($\times 10^{15}$ $cm^{-3}$) | 9.1 | 9.2 | 8.8 | 9.0 | 9.3 | 9.2 |
| | in-plane standard deviation of carrier concentration ($\times 10^{15}$ $cm^{-3}$) | 1.5 | 1.8 | 1.0 | 4.3 | 2.2 | 1.9 |
| | evaluation of in-plane uniformity of carrier concentration | satisfactory | satisfactory | satisfactory | unsatisfactory | satisfactory | satisfactory |

| | | Examples | | | | |
|---|---|---|---|---|---|---|
| | | E7 | E8 | E9 | E10 | E11 |
| support substrate | material | W | $ZrB_2$ | Mo | W | $ZrB_2$ |
| | Young's modulus $E_s$ (GPa) | 380 | 450 | 320 | 380 | 450 |
| | thermal expansion coefficient $\alpha_s$ ($\times 10^{-6} K^{-1}$) | 4.5 | 6.2 | 5.1 | 4.5 | 6.2 |
| | thermal conductivity ($W \cdot m^{-1} \cdot K^{-1}$) | 170 | 57 | 140 | 170 | 57 |
| | thickness $t_s$ (mm) | 0.6 | 0.6 | 0.7 | 0.7 | 0.7 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ ($\times 10^{-6} K^{-1}$) | 5.9 | 5.9 | 5.9 | 5.9 | 5.9 |
| | thickness $t_f$ (mm) | 0.05 | 0.05 | 0.05 | 0.05 | 0.05 |

TABLE 5-continued

| | | | | | | |
|---|---|---|---|---|---|---|
| group III nitride composite substrate | thermal expansion coefficient difference $\Delta\alpha$ | 1.4 | −0.3 | 0.8 | 1.4 | −0.3 |
| | Young's modulus ratio $E_f/E_s$ | 0.39 | 0.33 | 0.47 | 0.39 | 0.33 |
| | diameter (mm) | 100 | 100 | 150 | 150 | 150 |
| | $E_f \cdot |\Delta\alpha|/E_s$ (×10$^{-6}$K$^{-1}$) [parameter X] | 0.553 | 0.100 | 0.375 | 0.553 | 0.100 |
| | $t_s^2/t_f$ (mm) [parameter Y] | 7.2 | 7.2 | 9.8 | 9.8 | 9.8 |
| | parameter Y/X | 13.0 | 72.0 | 26.1 | 17.7 | 98.0 |
| laminated group III nitride composite substrate | appearance evaluation | satisfactory | satisfactory | satisfactory | satisfactory | satisfactory |
| | in-plane average of carrier concentration (×10$^{15}$ cm$^{-3}$) | 9.1 | 9.0 | 9.0 | 9.1 | 8.9 |
| | in-plane standard deviation of carrier concentration (×10$^{15}$ cm$^{-3}$) | 2.3 | 1.4 | 2.0 | 2.4 | 1.5 |
| | evaluation of in-plane uniformity of carrier concentration | satisfactory | satisfactory | satisfactory | satisfactory | satisfactory |

Referring to Table 5, as to Example E4 where the absolute value of the difference $\Delta\alpha$ in thermal expansion coefficient between the support substrate and the group III nitride film was large, crack occurred to the group III nitride film and the group III nitride layer of the laminated group III nitride composite substrate, and thus the appearance was unsatisfactory. As to Examples E1 to E3 and E5 to E11 where the absolute value of the difference $\Delta\alpha$ in thermal expansion coefficient between the support substrate and the group III nitride film was small, no crack and no peeling occurred to the group III nitride film and the group III nitride layer of the laminated group III nitride composite substrate, and thus the appearance was satisfactory. Regarding the uniformity, in a plane parallel to a main surface, of the carrier concentration in the carrier drift layer of the group III nitride layer in the laminated group III nitride composite substrate, Example E4 was also unsatisfactory and Examples E1 to E3 and E5 to E11 were also satisfactory. It should be noted that the degree of this tendency varied depending on the type of the material for the support substrate.

Example F

Group III nitride composite substrates were fabricated similarly to Example E, except that the group III nitride composite substrates with a diameter of 75 mm were fabricated in which an Mo substrate whose main surface was mirror-finished (with an RMS of 10 nm or less) or a W substrate whose main surface was mirror-finished (with an RMS of 10 nm or less) was used as the support substrate, and respective support substrates and respective group III nitride films were different from each other in terms of the thickness as seen from Examples F1 to F10 in Table 6, and the group III nitride layer was grown on the group III nitride film of the group III nitride composite substrate to thereby fabricate the laminated group III nitride composite substrate. Further, the appearance of the laminated group III nitride composite substrate thus fabricated and the in-plane uniformity of the carrier concentration were evaluated. The results are summarized in Table 6.

TABLE 6

| | | Examples | | | | |
|---|---|---|---|---|---|---|
| | | F1 | F2 | F3 | F4 | F5 |
| support substrate | material | Mo | Mo | Mo | Mo | Mo |
| | Young's modulus $E_s$ (GPa) | 320 | 320 | 320 | 320 | 320 |
| | thermal expansion coefficient $\alpha_s$ (×10$^{-6}$K$^{-1}$) | 5.1 | 5.1 | 5.1 | 5.1 | 5.1 |
| | thermal conductivity (W·m$^{-1}$·K$^{-1}$) | 140 | 140 | 140 | 140 | 140 |
| | thickness $t_s$ (mm) | 0.5 | 0.4 | 0.3 | 0.5 | 0.5 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ (×10$^{-6}$K$^{-1}$) | 5.9 | 5.9 | 5.9 | 5.9 | 5.9 |
| | thickness $t_f$ (mm) | 0.05 | 0.05 | 0.05 | 0.1 | 0.15 |
| group III nitride composite substrate | thermal expansion coefficient difference $\Delta\alpha$ | 0.8 | 0.8 | 0.8 | 0.8 | 0.8 |
| | Young's modulus ratio $E_f/E_s$ | 0.47 | 0.47 | 0.47 | 0.47 | 0.47 |
| | diameter (mm) | 75 | 75 | 75 | 75 | 75 |
| | $E_f \cdot |\Delta\alpha|/E_s$ (×10$^{-6}$K$^{-1}$) [parameter X] | 0.375 | 0.375 | 0.375 | 0.375 | 0.375 |
| | $t_s^2/t_f$ (mm) [parameter Y] | 5.0 | 3.2 | 1.8 | 2.5 | 1.7 |
| | parameter Y/X | 13.3 | 8.53 | 4.80 | 6.67 | 4.53 |
| laminated group III nitride composite substrate | appearance evaluation | satisfactory | satisfactory | satisfactory | satisfactory | satisfactory |
| | in-plane average of carrier concentration (×10$^{15}$ cm$^{-3}$) | 9.1 | 9.2 | 9.2 | 9.0 | 9.1 |
| | in-plane standard deviation of carrier concentration (×10$^{15}$ cm$^{-3}$) | 1.5 | 1.8 | 3.0 | 2.4 | 2.8 |
| | evaluation of in-plane uniformity of carrier concentration | satisfactory | satisfactory | unsatisfactory | satisfactory | unsatisfactory |

TABLE 6-continued

| | | Examples | | | | |
|---|---|---|---|---|---|---|
| | | F6 | F7 | F8 | F9 | F10 |
| support substrate | material | Mo | W | W | W | W |
| | Young's modulus $E_s$ (GPa) | 320 | 380 | 380 | 330 | 380 |
| | thermal expansion coefficient $\alpha_s$ ($\times 10^{-6} K^{-1}$) | 5.1 | 4.5 | 4.5 | 4.5 | 4.5 |
| | thermal conductivity ($W \cdot m^{-1} \cdot K^{-1}$) | 140 | 170 | 170 | 170 | 170 |
| | thickness $t_s$ (mm) | 0.5 | 0.5 | 0.4 | 0.3 | 0.5 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ ($\times 10^{-6} K^{-1}$) | 5.9 | 5.9 | 5.9 | 5.9 | 5.9 |
| | thickness $t_f$ (mm) | 0.2 | 0.05 | 0.05 | 0.05 | 0.1 |
| group III nitride composite substrate | thermal expansion coefficient difference $\Delta\alpha$ | 0.8 | 1.4 | 1.4 | 1.4 | 1.4 |
| | Young's modulus ratio $E_f/E_s$ | 0.47 | 0.39 | 0.39 | 0.39 | 0.39 |
| | diameter (mm) | 75 | 75 | 75 | 75 | 75 |
| | $E_f \cdot |\Delta\alpha|/E_s$ ($\times 10^{-6} K^{-1}$) [parameter X] | 0.375 | 0.553 | 0.553 | 0.553 | 0.553 |
| | $t_s^2/t_f$ (mm) [parameter Y] | 1.3 | 5.0 | 3.2 | 1.8 | 2.5 |
| | parameter Y/X | 3.47 | 9.04 | 5.79 | 3.25 | 4.52 |
| laminated group III nitride composite substrate | appearance evaluation | satisfactory | satisfactory | satisfactory | satisfactory | satisfactory |
| | in-plane average of carrier concentration ($\times 10^{15} cm^{-3}$) | 9.2 | 9.1 | 9.2 | 9.2 | 9.2 |
| | in-plane standard deviation of carrier concentration ($\times 10^{15} cm^{-3}$) | 3.3 | 2.2 | 2.6 | 3.3 | 2.8 |
| | evaluation of in-plane uniformity of carrier concentration | unsatisfactory | satisfactory | unsatisfactory | unsatisfactory | unsatisfactory |

Referring to Table 6, as to all of Examples F1 to F10, no crack and no peeling occurred to the group III nitride film and the group III nitride layer of the laminated group III nitride composite substrate, and thus the appearance was satisfactory. Regarding the uniformity, in a plane parallel to a main surface, of the carrier concentration in the carrier drift layer of the group III nitride layer in the laminated group III nitride composite substrate, Examples F3, F8, and F9 where the thickness of the support substrate was small as well as Examples F5 and F6 where the thickness of the group III nitride film was large were unsatisfactory, while Examples F1, F2, F4, and F7 where the thickness of the support substrate was large and the thickness of the group III nitride film was small were satisfactory. It should be noted that the degree of this tendency varied depending on the type of the material for the support substrate.

<Study Based on Examples A to F>

As seen from the above-described Examples A to F, depending on the type of the material and the thickness of the support substrate as well as the thickness of the group III nitride film, the resultant appearance of the laminated group III nitride composite substrate in which the group III nitride layer was grown on the group III nitride film of the group III nitride composite substrate, and the resultant uniformity of distribution, in a plane parallel to a main surface, of the carrier concentration in the group III nitride layer varied.

Based on the above results, the appearance of the laminated group III nitride composite substrate and the uniformity of distribution, in a plane parallel to a main surface, of the carrier concentration in the group III nitride layer were studied as follows.

1. As to Appearance of Laminated Group III Nitride Composite Substrate

As to the appearance of the laminated group III nitride composite substrate, particularly as to whether or not crack occurs to the group III nitride layer and the group III nitride film of the laminated group III nitride composite substrate and whether or not the group III nitride layer and the group III nitride film peel from the support substrate, study was conducted as follows, in terms of the thermal stress applied to the group III nitride composite substrate during epitaxial growth of the group III nitride layer on the group III nitride film of the group III nitride composite substrate.

The group III nitride composite substrate of the above-described Examples was subjected to a thermal stress during annealing at 800° C. which was done for increasing the bonding strength after the support substrate and the group III nitride film donor substrate were bonded together with the joint film interposed therebetween, and further subjected to a greater thermal stress during epitaxial growth of the group III nitride layer at 1050° C. on the group III nitride film of the group III nitride composite substrate. Regarding some of the laminated group III nitride composite substrates, crack of the group III nitride layer and the group III nitride film as well as peeling thereof from the support substrate were considered as being caused by the thermal stress.

This thermal stress $\sigma_T$ (unit: Pa) was generated due to difference $\Delta\alpha$ (unit: $\times 10^{-6} K^{-1}$) in thermal expansion coefficient determined by subtracting thermal expansion coefficient $\alpha_s$ (unit: $\times 10^{-6} K^{-1}$) of support substrate 11 from thermal expansion coefficient $\alpha_f$ (unit: $\times 10^{-6} K^{-1}$) of group III nitride film 13, and was represented by the following formula (2):

$$\sigma_T = E_f \cdot |\Delta\alpha| \cdot \Delta T/(1-\nu_f) \qquad (2)$$

where it is supposed that thickness $t_f$ (unit: mm) of group III nitride film 13 was smaller than thickness $t_s$ (unit: mm) of support substrate 11, $E_f$ is Young's modulus (unit: GPa) of group III nitride film 13, $\nu_f$ is Poisson's ratio (unit: dimensionless) of group III nitride film 13, $\Delta T$ is a temperature difference (unit: ° C.) determined by subtracting a formation temperature $T_b$ (unit: ° C.) of group III nitride composite substrate 1 (specifically the annealing temperature when the group III nitride composite substrate is formed) from a growth temperature $T_g$ (unit: ° C.) of the group III nitride layer, and $\Delta\alpha$ is the difference in thermal expansion coefficient. In other words, it was found that the difference $\Delta\alpha$ in thermal expansion coefficient between the support substrate and the group III nitride film was an important factor determining thermal stress $\sigma_T$.

Figure 18:
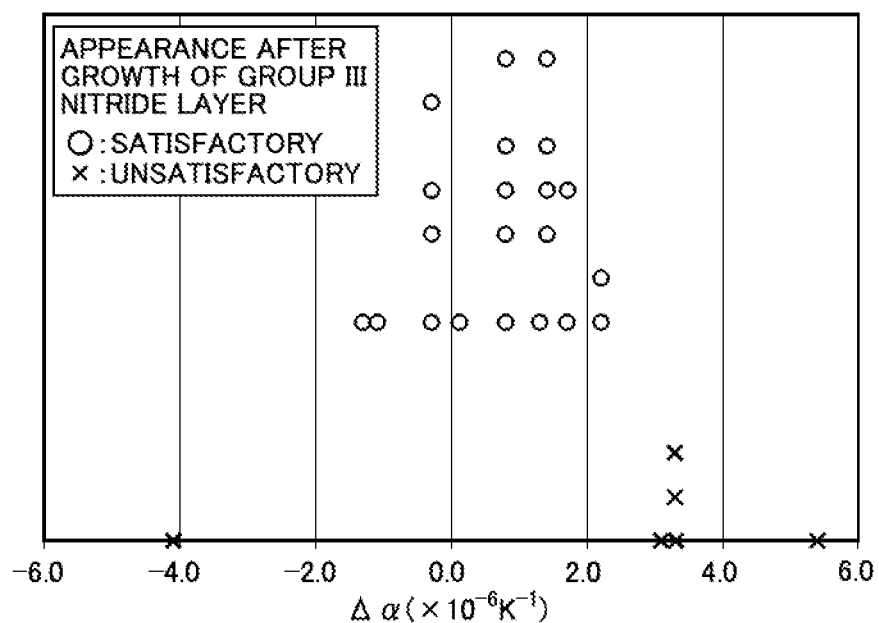
FIG. 18 is a graph showing a relation between a difference in thermal expansion coefficient between a support substrate and a group III nitride film of a group III nitride composite substrate, and an appearance of a group III nitride layer after its growth, of the group III nitride composite substrate.

In view of the above, for each of the above-described Examples A to F, the quality of the appearance of the laminated group III nitride composite substrate was plotted with respect to the difference $\Delta\alpha$ in thermal expansion coefficient. The results are shown in FIG. 18. As clearly seen from FIG. 18, it has been found, in the case where a group III nitride composite substrate including a support substrate and a group III nitride film having an absolute value $|\Delta\alpha|$ of the difference $\Delta\alpha$ in thermal expansion coefficient of $2.2\times10^{-6}$ K$^{-1}$ or less is used, crack of the group III nitride layer and the group III nitride film and peeling thereof from the support substrate do not occur. Here, in the case of $\Delta\alpha>0$, the composite substrate deformed in a convex shape in the direction toward group III nitride film 13 at the growth temperature of the group III nitride layer. In the case of $\Delta\alpha<0$, the composite substrate deformed in a concave shape in the direction away from group III nitride film 13 at the growth temperature of the group III nitride layer. The results in FIG. 18 represent that regardless of the direction of deformation (namely whether $\Delta\alpha$ is positive or negative), crack or peeling will not occur after growth of the group III nitride layer as long as the absolute value $|\Delta\alpha|$ of $\Delta\alpha$ is $2.2\times10^{-6}$ K$^{-1}$ or less.

2. As to Uniformity of Distribution, in Plane Parallel to Main Surface, of Carrier Concentration in Group III Nitride Layer The uniformity of distribution, in a plane parallel to a main surface, of the carrier concentration in the group III nitride layer significantly varied depending on, for example, the type of the material and the thickness of the support substrate as well as the thickness of the group III nitride film. The distribution, in a plane parallel to a main surface, of the carrier concentration in the group III nitride layer varied concentrically in any example.

It was accordingly considered that the distribution, in a plane parallel to a main surface, of the carrier concentration in the group III nitride layer was generated due to warp of the group III nitride composite substrate during epitaxial growth of the group III nitride layer on the group III nitride film of the group III nitride composite substrate. Namely, it was considered that disturbance of the temperature distribution and the gas flow across the surface of the group III nitride film, resultant from the warp of the group III nitride composite substrate, affected the in-plane distribution of the carrier concentration.

Accordingly, a radius of curvature R (unit: m) due to warp of group III nitride composite substrate 1 when at least one group III nitride layer was grown on the group III nitride film of the group III nitride composite substrate, was represented, based on the Stoney's equation, by the following formula (3):

$$R=E_s/\{6(1-v_s)\sigma_T\}\cdot t_s^2/t_f \quad (3)$$

where $E_S$ is Young's modulus (unit: GPa) of the support substrate, $t_s$ is thickness (unit: mm) of the support substrate, $t_f$ is thickness (unit: mm) of the group III nitride film, and $\sigma_T$ is thermal stress (unit: Pa).

Next, the formula (2) was substituted in the formula (3) to obtain the following formula (4):

$$R=E_S/\{E_f|\Delta\alpha|\cdot\Delta T\}/\{6(1-v_S)/(1-v_f)\}\cdot t_s^2/t_f \quad (4)$$

The above formula (4) was deformed to the following formula (5):

$$t_s^2/t_f=[R\Delta T(1-v_f)/6(1-v_S)]E_f|\Delta\alpha|/E_S \quad (5)$$

This formula (5) indicates that parameter Y, namely $t_s^2/t_f$ regarding respective thicknesses of the support substrate and the group III nitride film has a predetermined relation to parameter X, namely $E_f|\Delta\alpha|/E_S$ regarding respective Young's moduli of the support substrate and the group III nitride film and the thermal expansion coefficient difference therebetween.

Figure 19:
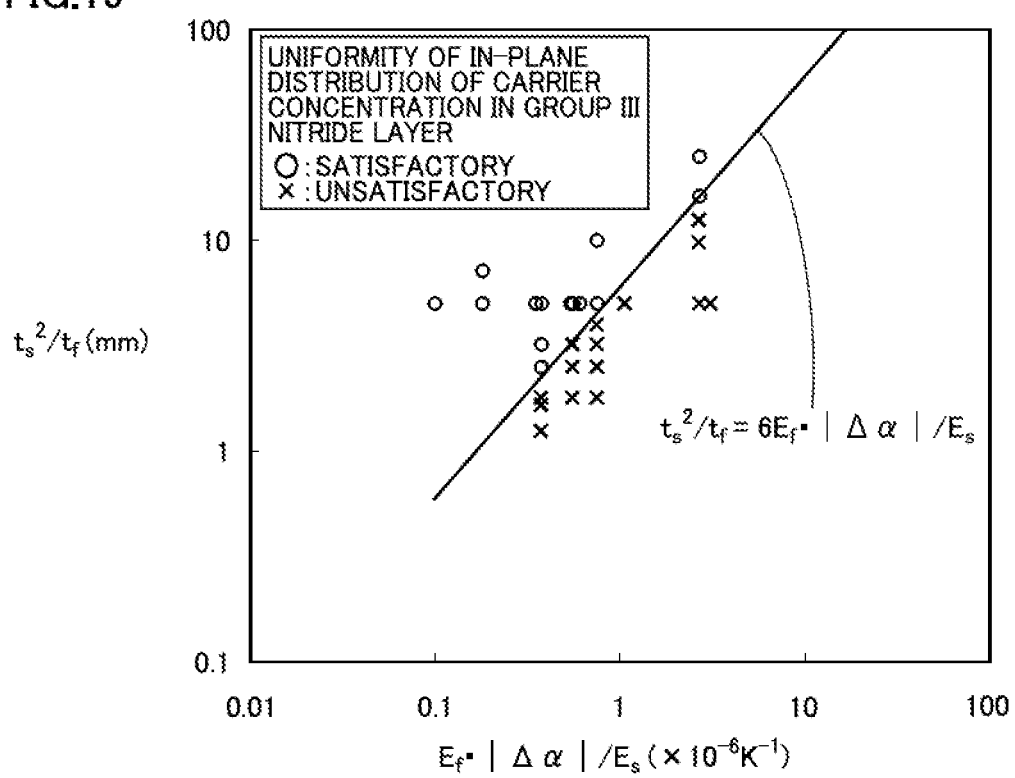
FIG. 19 is a graph showing a relation between a difference in thermal expansion coefficient and a Young's modulus ratio between a support substrate and a group III nitride film of a group III nitride composite substrate, a thickness ratio between the support substrate and the group III nitride film of the group III nitride composite substrate, and a uniformity of in-plane distribution of the carrier concentration in a group III nitride layer.

In view of the above, with respect to $E_f|\Delta\alpha|/E_S$ (parameter X) regarding the material characteristics (Young's modulus and thermal expansion coefficient) of the support substrate and the group III nitride film and $t_s^2/t_f$ (parameter Y) regarding respective thicknesses of the support substrate and the group III nitride film, the quality of the uniformity of distribution, in a plane parallel to a main surface, of the carrier concentration in the group III nitride layer was plotted. The results are shown in FIG. 19. In FIG. 19, an in-plane standard deviation of the carrier concentration of $2.5\times10^{15}$ cm$^{-3}$ or less is identified as a satisfactory uniformity of in-plane distribution of the carrier concentration and indicated by the O mark, while an in-plane standard deviation of the carrier concentration of more than $2.5\times10^{15}$ cm$^{-3}$ is identified as an unsatisfactory uniformity of in-plane distribution of the carrier concentration and indicated by the X mark.

Referring to FIG. 19, it has been found that the uniformity of distribution, in a plane parallel to a main surface, of the carrier concentration in group III nitride layer 20 is satisfactory when $E_f|\Delta\alpha|/E_S$ (parameter X) and $t_s^2/t_f$ (parameter Y) satisfy the relation:

$$t_s^2/t_f \geq 6E_f|\Delta\alpha|/E_s \quad (1).$$

3. As to Thicknesses of Support Substrate and Group III Nitride Film

It has been found that thickness $t_s$ of the support substrate and thickness $t_f$ of the group III nitride film that are designed so that they satisfy the above formula (1) improve the uniformity of distribution, in a plane parallel to a main surface, of the carrier concentration in the group III nitride layer.

It has also been found that thickness $t_s$ of the support substrate is appropriately 0.1 mm or more since it provides a high mechanical strength and high ease of handling of the group III nitride composite substrate, and is appropriately 1 mm or less since it provides lower cost and high ease of handling of the group III nitride composite substrate.

Example G

Referring to FIG. 14, the present example is an example where an SBD (schottky barrier diode) was fabricated as group III nitride semiconductor device 4 including device support substrate 40.

1. Fabrication of Group III Nitride Composite Substrate

Group III nitride composite substrates were fabricated similarly to Example A, except that the group III nitride composite substrates were fabricated in which an Al$_2$O$_3$—SiO$_2$ composite oxide substrate where Al$_2$O$_3$ was 85 mass % and SiO$_2$ was 15 mass % relative to the whole substrate was used as the support substrate, and respective support substrates had different thicknesses and the group III nitride composite substrates had different diameters, as seen from Examples G1 to G8 in Table 7.

2. Fabrication of Group III Nitride Semiconductor Device

Referring to FIG. 14 (A), on group III nitride film 13 of group III nitride composite substrate 1, group III nitride layer 20, specifically n$^+$-GaN layer 201 serving as a carrier stop layer and having a carrier concentration of $2\times10^{18}$ cm$^{-3}$ and a thickness of 1 μm and n$^-$-GaN layer 202 serving as a carrier drift layer and having a carrier concentration of $1\times10^{16}$ cm$^{-3}$ and a thickness of 5 μm were epitaxially grown in this order, and thereby laminated group III nitride composite substrate 2 was fabricated, similarly to Example A.

The appearance of the laminated group III nitride composite substrate thus fabricated and the in-plane uniformity of the carrier concentration were evaluated similarly to Example A. As to all of Examples G1 to G8, no crack and no peeling occurred to the group III nitride film and the group III nitride layer of the laminated group III nitride composite substrate, and thus the appearance was satisfactory. The in-plane uniformity of the carrier concentration was also satisfactory. The results are summarized in Table 7.

Referring next to FIG. 14 (B), on n⁻-GaN layer 202 namely the topmost layer of group III nitride layer 20 in laminated group III nitride composite substrate 2, insulating film 300 for a field plate, specifically an $SiN_x$ film having a thickness of 500 nm was formed by plasma CVD from $SiH_4$ and $NH_3$ used as materials. After this, an RTA (rapid thermal annealing) apparatus was used to perform heat treatment in $N_2$ at 600° C. for three minutes. Next, a resist mask formed by photolithography was used to perform etching for 15 minutes with buffered hydrofluoric acid (a mixture of an aqueous solution of 50 mass % HF (hydrofluoric acid) and an aqueous solution of 40 mass % $NH_4F$ (ammonium fluoride) at a volume ratio of 1:5, which is applied as well in the following) to remove the SiN film in an opening of the resist mask, and thereby form insulating film 300 having an opening as a field plate. Here, the shape in plan view of each opening of insulating film 300 was a square having a side of 1 mm. After the etching, the resist was removed by means of acetone.

Next, photolithography was applied to form a resist mask (not shown), EB vapor deposition was applied to form an Ni layer with a thickness of 50 nm and an Au layer with a thickness of 300 nm, and the resist mask was lifted off in acetone. Accordingly, a patterned schottky electrode was formed as first electrode 30. Each schottky electrode provided as first electrode 30 had a shape in plan view of a square having a side of 1.1 mm. A field plate edge-termination structure was thus formed where first electrode 30 was disposed on n⁻-GaN layer 202 under the opening of insulating film 300 and on insulating film 300 in a range of 50 μm from the perimeter of the opening of insulating film 300.

Referring next to FIG. 14 (C), on the whole surface of first electrode 30 and insulating film 300, EB vapor deposition was applied to form, as barrier film 330, an Ni layer with a thickness of 50 nm, a Pt layer with a thickness of 400 nm, and an Au layer with a thickness of 100 nm. This barrier film 330 can prevent deterioration of the schottky characteristic due to diffusion for example of metal atoms in joint metal film 44 in the later step of bonding device support substrate 40.

Next, on device support substrate 40, EB vapor deposition was applied to form, as pad electrode 43 serving as an ohmic electrode, an Ni layer with a thickness of 50 nm, a Pt layer with a thickness of 400 nm, and an Au layer with a thickness of 100 nm. Further, on pad electrode 43, resistance-heating vapor-deposition was applied to form, as joint metal film 44, an AuSn film (70 mass % of Au and 30 mass % of Sn) with a thickness of 5 μm was formed.

Here, as device support substrates 40 of Examples G1 and G2 each, an Si substrate having a Young's modulus of 185 GPa, a thermal expansion coefficient of $2.6×10^{-6}$ K⁻¹, a thermal conductivity of 150 W·m⁻¹·K⁻¹, and a specific resistance of 1 mΩcm was used. As device support substrate 40 of Examples G3 and G6 each, a CuW substrate containing 6 mass % of Cu and 94 mass % of W relative to the whole substrate and having a Young's modulus of 350 GPa, a thermal expansion coefficient of $6.0×10^{-6}$ K⁻¹, a thermal conductivity of 130 W·m⁻¹·K⁻¹, and a specific resistance of 0.1 μΩcm was used. As device support substrate 40 of Example G4, a Cu-diamond substrate containing 60 vol % of Cu and 40 vol % of diamond relative to the whole substrate and having a Young's modulus of 410 GPa, a thermal expansion coefficient of $6.0×10^{-6}$ K⁻¹, a thermal conductivity of 560 W·m⁻¹·K⁻¹, and a specific resistance of 500 μΩcm was used. As device support substrate 40 of Example G5, a Kovar substrate containing 54 mass % of Fe, 29 mass % of Ni, and 17 mass % of Co and having a Young's modulus of 140 GPa, a thermal expansion coefficient of $5.3×10^{-6}$ K⁻¹, a thermal conductivity of 17 W·m⁻¹·K⁻¹, and a specific resistance of 100 μΩcm was used. As device support substrate 40 of Example G7, an Mo substrate having a Young's modulus of 320 GPa, a thermal expansion coefficient of $5.1×10^{-6}$ K⁻¹, a thermal conductivity of 140 W·m⁻¹·K⁻¹, and a specific resistance of 5.7 μΩcm was used. As device support substrate 40 of Example G8, a W substrate having a Young's modulus of 380 GPa, a thermal expansion coefficient of $4.5×10^{-6}$ K⁻¹, a thermal conductivity of 10 W·m⁻¹·K⁻¹, and a specific resistance of 5.4 μΩcm was used.

Next, a wafer bonder was used to join joint metal film 44 and barrier film 330 to each other. As to the joint conditions, they were joined in a vacuum atmosphere of less than 1 Pa at 300° C. for 10 minutes. After they were joined, the state of the joint surface was observed with an ultrasonic microscope. In all of Examples G1 to G8, a joint surface defect such as generation of a void was not found. In this way, laminated substrate 3 was obtained.

Referring next to FIG. 14 (D1), a surface grinder was used to grind support substrate 11 of laminated substrate 3, from the exposed main surface of support substrate 11 so that the thickness became 50 μm. Subsequently, support substrate 11 and joint film 12 of group III nitride composite substrate 1 were etched away from laminated substrate 3, by means of hydrofluoric acid. After this, group III nitride film 13 exposed by removal of support substrate 11 and joint film 12 from laminated substrate 3 was etched by ICP-RIE (inductively coupled plasma-reactive ion etching) using $Cl_2$ as an etching gas, so that it was etched from the exposed main surface to a depth of 200 nm.

Referring next to FIG. 14 (E1), on group III nitride film 13, EB vapor deposition was applied to successively form a Ti layer with a thickness of 20 nm, an Al layer with a thickness of 100 nm, a Ti layer with a thickness of 20 nm, and an Au layer with a thickness of 300 nm, to thereby form an ohmic electrode as second electrode 50 through lift-off in accordance with the position of the ohmic electrode which was first electrode 30, so that the shape in plan view was a square having a side of 1.4 mm. In the case where device support substrate 40 was an Si substrate, EB vapor deposition was applied to successively form, on device support substrate 40, an Ni layer with a thickness of 10 nm, a Pt layer with a thickness of 10 nm, and an Au layer with a thickness of 100 nm, to thereby form an ohmic electrode having a shape in plan view of a square with a side of 1.4 mm and serving as device support substrate electrode 45.

Next, group III nitride semiconductor device 4 in which first electrode 30, second electrode 50, and the like were formed was annealed by means of RTA in an $N_2$ atmosphere at 250° C. for three minutes. In this way, group III nitride semiconductor device 4 was obtained.

Group III nitride semiconductor device 4 thus obtained was fabricated into a chip in the following way. Group III nitride semiconductor device 4 including the Si substrate as device support substrate 40 was bonded to a UV (ultraviolet radiation)-curable dicing tape so that second electrode 50 was directed downward, and a dicer was used to dice device support substrate 40, group III nitride layer 20, and group III nitride film 13 in accordance with the above-described electrode pattern, into a chip having a shape in plan view of a square with a side of 1.5 mm.

The total number of group III nitride semiconductor devices obtained through the fabrication into chips, from the whole main surface of each group III nitride semiconductor device except for a region of the main surface of 5 mm from the outer perimeter, was as follows. From a substrate having a diameter of 75 mm, 150 devices were obtained. From a substrate having a diameter of 100 mm, 300 devices were obtained. From a substrate having a diameter of 150 mm, 700 devices were obtained.

For the group III nitride semiconductor devices fabricated in the form of chips, as obtained in the above-described way, a prober was used to measure current-voltage characteristics. An indicator of forward characteristics is defined as a forward voltage Vf at which the current density is 500 A/cm$^2$, and an indicator of reverse characteristics is defined as a reverse breakdown voltage Vr at which the current density is $1 \times 10^{-3}$ A/cm$^2$. Here, in the case where the group III nitride semiconductor device was an SBD, the group III nitride semiconductor device having a forward voltage Vf of 1.5 V or less and a reverse breakdown voltage Vr of 500 V or more was evaluated as satisfactory. The Vf yield is defined as a ratio of the number of group III nitride semiconductor devices having a forward voltage Vf of 1.5 V or less to the total number of group III nitride semiconductor devices, and the Vr yield is defined as a ratio of the number of group III nitride semiconductor devices having a reverse breakdown voltage Vr of 500 V or more to the total number of group III nitride semiconductor devices. Values of the characteristics of the obtained group III nitride semiconductor devices fabricated in the form of chips are summarized in Table 7.

TABLE 7

| | | Examples | | | |
|---|---|---|---|---|---|
| | | G1 | G2 | G3 | G4 |
| support substrate | material | Al$_2$O$_3$—SiO$_2$ | Al$_2$O$_3$—SiO$_2$ | Al$_2$O$_3$—SiO$_2$ | Al$_2$O$_3$—SiO$_2$ |
| | Young's modulus E$_s$ (GPa) | 250 | 250 | 250 | 250 |
| | thermal expansion coefficient α$_s$ (×10$^{-6}$K$^{-1}$) | 6.2 | 6.2 | 6.2 | 6.2 |
| | thermal conductivity (W·m$^{-1}$·K$^{-1}$) | 25 | 25 | 25 | 25 |
| | thickness t$_s$ (mm) | 0.5 | 0.6 | 0.6 | 0.6 |
| group III nitride film | material | GaN | GaN | GaN | GaN |
| | Young's modulus E$_f$ (GPa) | 150 | 150 | 150 | 150 |
| | thermal expansion coefficient α$_f$ (×10$^{-6}$K$^{-1}$) | 5.9 | 5.9 | 5.9 | 5.9 |
| | thickness t$_f$ (mm) | 0.05 | 0.05 | 0.05 | 0.05 |
| group III nitride composite substrate | thermal expansion coefficient difference Δα | −0.3 | −0.3 | −0.3 | −0.3 |
| | Young's modulus ratio E$_f$/E$_s$ | 0.60 | 0.60 | 0.60 | 0.60 |
| | diameter (mm) | 75 | 100 | 100 | 100 |
| | E$_f$·|Δα|/E$_s$ (×10$^{-6}$K$^{-1}$) [parameter X] | 0.180 | 0.180 | 0.180 | 0.180 |
| | t$_s^2$/t$_f$ (mm) [parameter Y] | 5.0 | 7.2 | 7.2 | 7.2 |
| | parameter Y/X | 27.8 | 40.0 | 40.0 | 40.0 |
| laminated group III nitride composite substrate | appearance evaluation | satisfactory | satisfactory | satisfactory | satisfactory |
| | in-plane average of carrier concentration (×10$^{15}$ cm$^{-3}$) | 9.1 | 9.2 | 9.0 | 9.1 |
| | in-plane standard deviation of carrier concentration (×10$^{15}$ cm$^{-3}$) | 1.5 | 1.7 | 1.5 | 1.4 |
| | evaluation of in-plane uniformity of carrier concentration | satisfactory | satisfactory | satisfactory | satisfactory |
| device support substrate | material | Si | Si | CuW | Cu-diamond |
| group III nitride semiconductor device | appearance of group III nitride semiconductor device | satisfactory | unsatisfactory | satisfactory | satisfactory |
| | Vr yield (%) [500 V or more where $1 \times 10^{-3}$ A/cm$^2$] | 68 | 30 | 63 | 65 |
| | Vf yield (%) [1.5 V or less where 500 A/cm$^2$] | 75 | 50 | 69 | 77 |

| | | Examples | | | |
|---|---|---|---|---|---|
| | | G5 | G6 | G7 | G8 |
| support substrate | material | Al$_2$O$_3$—SiO$_2$ | Al$_2$O$_3$—SiO$_2$ | Al$_2$O$_3$—SiO$_2$ | Al$_2$O$_3$—SiO$_2$ |
| | Young's modulus E$_s$ (GPa) | 250 | 250 | 250 | 250 |
| | thermal expansion coefficient α$_s$ (×10$^{-6}$K$^{-1}$) | 6.2 | 6.2 | 6.2 | 6.2 |
| | thermal conductivity (W·m$^{-1}$·K$^{-1}$) | 25 | 25 | 25 | 25 |
| | thickness t$_s$ (mm) | 0.6 | 0.7 | 0.7 | 0.7 |
| group III nitride film | material | GaN | GaN | GaN | GaN |
| | Young's modulus E$_f$ (GPa) | 150 | 150 | 150 | 150 |
| | thermal expansion coefficient α$_f$ (×10$^{-6}$K$^{-1}$) | 5.9 | 5.9 | 5.9 | 5.9 |
| | thickness t$_f$ (mm) | 0.05 | 0.05 | 0.05 | 0.05 |
| group III nitride composite substrate | thermal expansion coefficient difference Δα | −0.3 | −0.3 | −0.3 | −0.3 |
| | Young's modulus ratio E$_f$/E$_s$ | 0.60 | 0.60 | 0.60 | 0.60 |
| | diameter (mm) | 100 | 150 | 150 | 150 |
| | E$_f$·|Δα|/E$_s$ (×10$^{-6}$K$^{-1}$) [parameter X] | 0.180 | 0.180 | 0.180 | 0.180 |
| | t$_s^2$/t$_f$ (mm) [parameter Y] | 7.2 | 9.8 | 9.8 | 9.8 |
| | parameter Y/X | 40.0 | 54.4 | 54.4 | 54.4 |

TABLE 7-continued

| | | | | | |
|---|---|---|---|---|---|
| laminated group III nitride composite substrate | appearance evaluation | satisfactory | satisfactory | satisfactory | satisfactory |
| | in-plane average of carrier concentration ($\times 10^{15}$ cm$^{-3}$) | 9.0 | 9.1 | 9.0 | 9.2 |
| | in-plane standard deviation of carrier concentration ($\times 10^{15}$ cm$^{-3}$) | 1.6 | 1.9 | 2.1 | 2.0 |
| | evaluation of in-plane uniformity of carrier concentration | satisfactory | satisfactory | satisfactory | satisfactory |
| device support substrate | material | Kovar | CuW | Mo | W |
| group III nitride semiconductor device | appearance of group III nitride semiconductor device | satisfactory | satisfactory | satisfactory | satisfactory |
| | Vr yield (%) [500 V or more where $1 \times 10^{-3}$ A/cm$^2$] | 63 | 61 | 60 | 60 |
| | Vf yield (%) [1.5 V or less where 500 A/cm$^2$] | 74 | 72 | 70 | 72 |

Referring to Table 7, it is seen from Examples G1 and G2 that the group III nitride semiconductor device in which the Si substrate was used as the support substrate had a high Vf yield and a high Vr yield of 60% or more in the case where the diameter was 75 mm, while the group III nitride semiconductor device had a lower Vf yield and a lower Vr yield of 50% or less in the case where the diameter was 100 mm, due to the fact that the group III nitride layer and the group III nitride film partially peeled off from the device support substrate, after they were bonded to the device support substrate. It is seen from Examples G3 to G8 that in the case where a CuW substrate, Cu-diamond substrate, or Kovar substrate having a diameter of 100 mm was used as the support substrate and in the case where a CuW substrate, Mo substrate, or W substrate having a diameter of 150 mm was used as the support substrate, the group III nitride layer and the group III film were satisfactorily bonded across the whole surface to the device support substrate, and accordingly a high Vf yield and a high Vr yield of 60% or more were achieved.

Example H

Referring to FIG. 15, the present example is an example where an SBD was fabricated as group III nitride semiconductor device 4 including support substrate 11.

1. Fabrication of Group III Nitride Composite Substrate

Group III nitride composite substrates were fabricated similarly to Example E, except that the group III nitride composite substrates having a diameter of 75 mm were fabricated in which an Mo substrate or W substrate whose main surface was mirror-polished (with an RMS of 10 nm or less) was used as the support substrate and the thickness of the support substrate and the thickness of the group III nitride film were made different depending on the Examples as seen from Examples H1 to H4 and H6 to H8 in Table 8.

Figure 13:
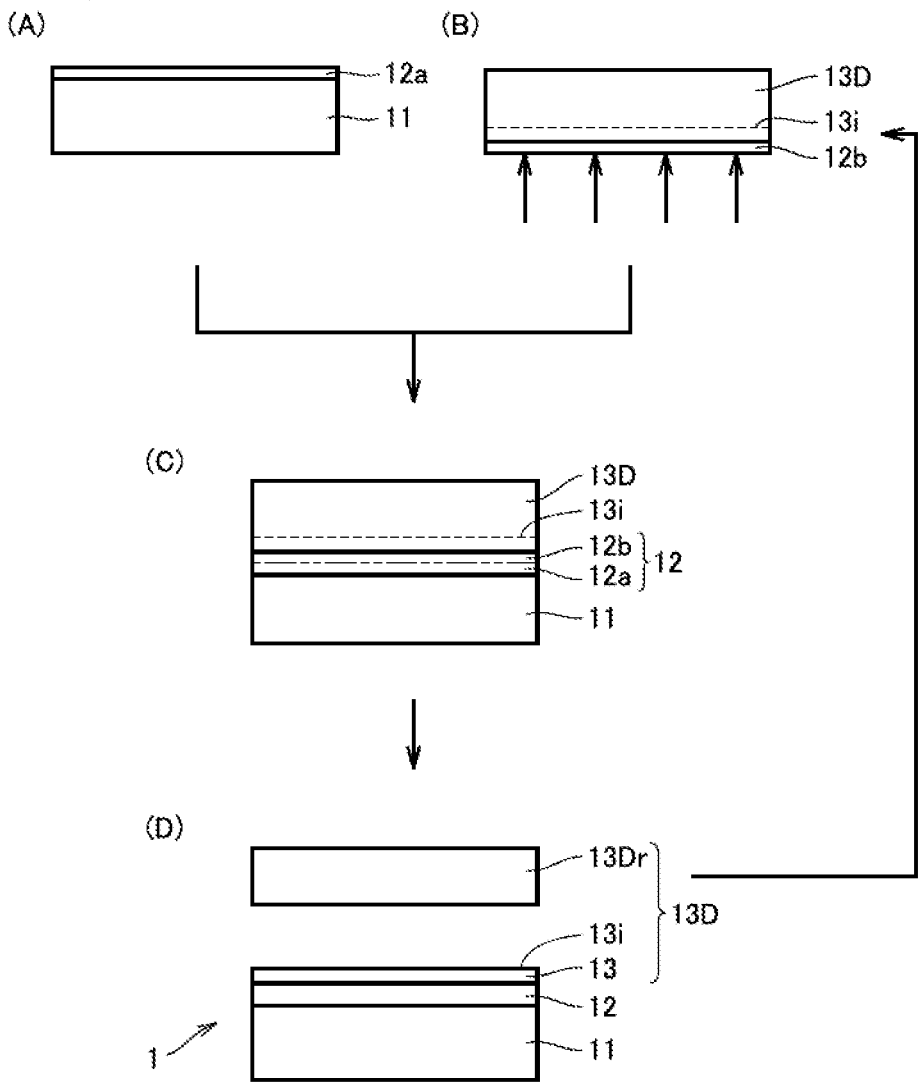
FIG. 13 is a schematic cross-sectional view showing an example of the method for manufacturing a group III nitride composite substrate using an ion implantation method.

As to Example H5, referring to FIG. 13, the aforementioned Mo substrate was used as support substrate 11 and, as shown in FIG. 13 (B), hydrogen ions were implanted into a GaN crystal body having a predetermined diameter that was group III nitride film donor substrate 13D, to a predetermined depth from its main surface, to thereby form an ion implantation region 13i. After this, as shown in FIG. 13 (C), support substrate 11 and the ion implantation region 13i side of group III nitride film donor substrate 13D were bonded together with joint film 12 interposed therebetween. After this, as shown in FIG. 13 (D), annealing was performed at 850° C. to thereby separate group III nitride film donor substrate 13D along its ion implantation region 13i, and the surface of separation was polished to thereby fabricate a group III nitride composite substrate in which group III nitride film 13 had a thickness of 0.0005 mm.

2. Fabrication of Group III Nitride Semiconductor Device

Referring to FIG. 15 (A), on group III nitride film 13 of group III nitride composite substrate 1, group III nitride layer 20, specifically n$^+$-GaN layer 201 serving as a carrier stop layer and having a carrier concentration of $2 \times 10^{18}$ cm$^{-3}$ and a thickness of 1 μm and n-GaN layer 202 serving as a carrier drift layer and having a carrier concentration of $1 \times 10^{16}$ cm$^{-3}$ and a thickness of 5 μm were epitaxially grown in this order, and thereby laminated group III nitride composite substrate 2 was fabricated, similarly to Example A.

The appearance of the laminated group III nitride composite substrate thus obtained and the in-plane uniformity of the carrier concentration were evaluated similarly to Example A. As to all of Examples H1 to H8, no crack and no peeling occurred to the group III nitride film and the group III nitride layer of the laminated group III nitride composite substrate, and thus the appearance was satisfactory. As to the in-plane uniformity of the carrier concentration, it was unsatisfactory in Examples H3, H4, H7, and H8 where the thickness of the group III nitride film was large or the thickness of the support substrate was small, while it was satisfactory in the other examples, namely Examples H1, H2, H5, and H6. The results are summarized in Table 8.

Referring next to FIG. 15 (B), on the n$^-$-GaN layer 202 side of group III nitride layer 20, insulating film 300 having an opening and first electrode 30 serving as a schottky electrode were successively formed to thereby fabricate group III nitride semiconductor device 4, similarly to Example G. Although FIG. 15 (B) shows that second electrode 50 serving as an ohmic electrode is formed on support substrate 11, the Mo substrate and the W substrate used as support substrate 11 in the present Example both also serve as an ohmic electrode, and therefore, second electrode 50 was not provided on support substrate 11.

Next, the group III nitride semiconductor device thus obtained was fabricated into chips, similarly to Example G. For 150 group III nitride semiconductor devices fabricated in the form of chips that were obtained from the whole main surface of each group III nitride semiconductor device except for a region of 5 mm from the outer perimeter, the Vf yield and the Vr yield were determined similarly to Example G. Values of the characteristics of the obtained group III nitride semiconductor devices fabricated in the form of chips are summarized in Table 8.

TABLE 8

|  |  | Examples | | | |
| --- | --- | --- | --- | --- | --- |
|  |  | H1 | H2 | H3 | H4 |
| support substrate | material | Mo | Mo | Mo | Mo |
|  | Young's modulus $E_s$ (GPa) | 320 | 320 | 320 | 320 |
|  | thermal expansion coefficient $\alpha_s$ ($\times 10^{-6} K^{-1}$) | 5.1 | 5.1 | 5.1 | 5.1 |
|  | thermal conductivity ($W \cdot m^{-1} \cdot K^{-1}$) | 140 | 140 | 140 | 140 |
|  | thickness $t_s$ (mm) | 0.5 | 0.5 | 0.5 | 0.5 |
| group III nitride film | material | GaN | GaN | GaN | GaN |
|  | Young's modulus $E_f$ (GPa) | 150 | 150 | 150 | 150 |
|  | thermal expansion coefficient $\alpha_f$ ($\times 10^{-6} K^{-1}$) | 5.9 | 5.9 | 5.9 | 5.9 |
|  | thickness $t_f$ (mm) | 0.05 | 0.1 | 0.15 | 0.2 |
| group III nitride composite substrate | thermal expansion coefficient difference $\Delta\alpha$ | 0.8 | 0.8 | 0.8 | 0.8 |
|  | Young's modulus ratio $E_f/E_s$ | 0.47 | 0.47 | 0.47 | 0.47 |
|  | diameter (mm) | 75 | 75 | 75 | 75 |
|  | $E_f \cdot |\Delta\alpha|/E_s$ ($\times 10^{-6} K^{-1}$) [parameter X] | 0.375 | 0.375 | 0.375 | 0.375 |
|  | $t_s^2/t_f$ (mm) [parameter Y] | 5.0 | 2.5 | 1.7 | 1.3 |
|  | parameter Y/X | 13.3 | 6.67 | 4.53 | 3.47 |
| laminated group III nitride composite substrate | appearance evaluation | satisfactory | satisfactory | satisfactory | satisfactory |
|  | in-plane average of carrier concentration ($\times 10^{15}$ cm$^{-3}$) | 8.8 | 9.0 | 9.2 | 9.1 |
|  | in-plane standard deviation of carrier concentration ($\times 10^{15}$ cm$^{-3}$) | 1.7 | 2.2 | 2.8 | 3.4 |
|  | evaluation of in-plane uniformity of carrier concentration | satisfactory | satisfactory | unsatisfactory | unsatisfactory |
| group III nitride semiconductor device | appearance of group III nitride semiconductor device | satisfactory | satisfactory | satisfactory | satisfactory |
|  | Vr yield (%) [500 V or more where $1 \times 10^{-3}$ A/cm$^2$] | 65 | 53 | 48 | 44 |
|  | Vf yield (%) [1.5 V or less where 500 A/cm$^2$] | 72 | 60 | 53 | 50 |

|  |  | Examples | | | |
| --- | --- | --- | --- | --- | --- |
|  |  | H5 | H6 | H7 | H8 |
| support substrate | material | Mo | W | W | W |
|  | Young's modulus $E_s$ (GPa) | 320 | 380 | 380 | 380 |
|  | thermal expansion coefficient $\alpha_s$ ($\times 10^{-6} K^{-1}$) | 5.1 | 4.5 | 4.5 | 4.5 |
|  | thermal conductivity ($W \cdot m^{-1} \cdot K^{-1}$) | 140 | 170 | 170 | 170 |
|  | thickness $t_s$ (mm) | 0.5 | 0.5 | 0.4 | 0.5 |
| group III nitride film | material | GaN | GaN | GaN | GaN |
|  | Young's modulus $E_f$ (GPa) | 150 | 150 | 150 | 150 |
|  | thermal expansion coefficient $\alpha_f$ ($\times 10^{-6} K^{-1}$) | 5.9 | 5.9 | 5.9 | 5.9 |
|  | thickness $t_f$ (mm) | 0.0005 | 0.05 | 0.05 | 0.1 |
| group III nitride composite substrate | thermal expansion coefficient difference $\Delta\alpha$ | 0.8 | 1.4 | 1.4 | 1.4 |
|  | Young's modulus ratio $E_f/E_s$ | 0.47 | 0.39 | 0.39 | 0.39 |
|  | diameter (mm) | 75 | 75 | 75 | 75 |
|  | $E_f \cdot |\Delta\alpha|/E_s$ ($\times 10^{-6} K^{-1}$) [parameter X] | 0.375 | 0.553 | 0.553 | 0.553 |
|  | $t_s^2/t_f$ (mm) [parameter Y] | 500 | 5.0 | 3.2 | 2.5 |
|  | parameter Y/X | 1333 | 9.04 | 5.79 | 4.52 |
| laminated group III nitride composite substrate | appearance evaluation | satisfactory | satisfactory | satisfactory | satisfactory |
|  | in-plane average of carrier concentration ($\times 10^{15}$ cm$^{-3}$) | 8.8 | 9.0 | 9.2 | 9.2 |
|  | in-plane standard deviation of carrier concentration ($\times 10^{15}$ cm$^{-3}$) | 1.3 | 1.8 | 2.6 | 2.8 |
|  | evaluation of in-plane uniformity of carrier concentration | satisfactory | satisfactory | unsatisfactory | unsatisfactory |
| group III nitride semiconductor device | appearance of group III nitride semiconductor device | satisfactory | satisfactory | satisfactory | satisfactory |
|  | Vr yield (%) [500 V or more where $1 \times 10^{-3}$ A/cm$^2$] | 0 | 58 | 49 | 50 |
|  | Vf yield (%) [1.5 V or less where 500 A/cm$^2$] | 0 | 62 | 52 | 55 |

Referring to Table 8, as to the group III nitride semiconductor devices in which the Mo substrate was used as the support substrate, the in-plane uniformity of the carrier concentration in the group III nitride layer was satisfactory and the Vf yield and the Vr yield were high in the cases where the thickness of the group III nitride film was 0.05 mm and 0.1 mm as seen from Examples H1 and H2, while the in-plane uniformity of the carrier concentration in the group III nitride layer was unsatisfactory and the Vf yield and the Vr yield were low in the cases where the thickness of the group III nitride film was a greater, namely 0.15 mm and 0.2 mm as seen from Examples H3 and H4.

Further, as seen from Example H5, the in-plane uniformity of the carrier concentration in the group III nitride layer was satisfactory while the Vf yield and the Vr yield were both 0 in the case where the group III nitride film had an extremely small thickness of 0.0005 mm. Reasons for this were considered as follows. Regarding the group III nitride film of the group III nitride semiconductor device of Example H5, the crystal quality was deteriorated and a high-resistance layer was formed due to implantation of hydrogen ions, and the crystal quality of the group III nitride layer epitaxially grown on the group III nitride film having the deteriorated crystal quality was also deteriorated.

As to the group III nitride semiconductor devices in which the W substrate was used as the support substrate, the in-plane uniformity of the carrier concentration in the group III nitride layer was unsatisfactory and the Vf yield and the Vr yield were low in the cases where the support substrate had a small thickness of 0.4 mm and the group III nitride film had a large thickness of 0.1 mm as seen from Examples H7 and H5.

Example 1

Referring to FIG. 16, the present example is an example where a PND (pn junction diode) was fabricated as group III nitride semiconductor device 4 including device support substrate 40.

1. Fabrication of Group III Nitride Composite Substrate

Group III nitride composite substrates were fabricated similarly to Example A, except that the group III nitride composite substrates were fabricated in which an $Al_2O_3$—$SiO_2$ composite oxide substrate where $Al_2O_3$ was 85 mass % and $SiO_2$ was 15 mass % relative to the whole substrate was used as the support substrate, and respective support substrates had different thicknesses and respective group III nitride composite substrates had different diameters, as seen from Examples I1, I2, and I4 in Table 9.

As to Example I3, referring to FIG. 13, the aforementioned $Al_2O_3$—$SiO_2$ composite oxide substrate was used as support substrate 11 and, as shown in FIG. 13 (B), hydrogen ions were implanted into a GaN crystal body having a predetermined diameter that was group III nitride film donor substrate 13D, to a predetermined depth from its main surface, to thereby form an ion implantation region 13i. After this, as shown in FIG. 13 (C), support substrate 11 and the ion implantation region 13i side of group III nitride film donor substrate 13D were bonded together with joint film 12 interposed therebetween. After this, as shown in FIG. 13 (D), annealing was performed at 850° C. to thereby separate group III nitride film donor substrate 13D along its ion implantation region 13i, and the surface of separation was polished to thereby fabricate group III nitride composite substrate 1 in which group III nitride film 13 had a thickness of 0.0005 mm.

2. Fabrication of Group III Nitride Semiconductor Device

Referring to FIG. 16 (A), on group III nitride film 13 of group III nitride composite substrate 1, MOVPE was applied to epitaxially grow group III nitride layer 20, specifically to epitaxially grow, successively, n$^+$-GaN layer 203 serving as a carrier stop layer and having a carrier concentration of $2\times10^{18}$ cm$^{-3}$ and a thickness of 1 μm, n$^-$-GaN layer 204 serving as an n-type carrier drift layer and having a carrier concentration of $1\times10^{16}$ cm$^{-3}$ and a thickness of 5 μm, p$^-$-GaN layer 205 serving as a p-type layer and having an Mg concentration of $5\times10^{17}$ cm$^{-3}$ and a thickness of 0.5 μm, and p$^+$-GaN layer 206 serving as an ohmic contact layer and having an Mg concentration of $1\times10^{20}$ cm$^{-3}$ and a thickness of 0.05 μm. Accordingly, laminated group III nitride composite substrate 2 was obtained.

Here, the growth temperature of group III nitride layer 20 was 1050° C., TMG (trimethylgallium) and NH$_3$ were used as materials for GaN, SiH$_4$ was used as a material for Si dopant, and CP$_2$Mg (cyclopentadienyl magnesium) was used as a material for Mg dopant.

Next, referring to FIG. 16 (B), on group III nitride layer 20 of laminated group III nitride composite substrate 2, photolithography was applied to form a resist mask (not shown), and RIE (reactive ion etching) was applied to perform mesa etching. The size of the top surface of the mesa portion was a square having a side of 1.4 mm and the height of the mesa portion (depth of etching) was set to 0.8 μm. Subsequently, photolithography, EB vapor deposition, and lift-off were applied to successively form, on the p$^+$-GaN layer 206 side of group III nitride layer 20, an Ni layer with a thickness of 50 nm and an Au layer with a thickness of 100 nm so that the shape in plan view was a square having a side of 1.1 mm, to thereby form first electrode 30 serving as an ohmic electrode, and heat treatment was performed for alloying.

Referring next to FIG. 16 (C), on first electrode 30 and group III nitride layer 20, plasma CVD was applied to form an SiN$_x$ film as insulating film 300. Subsequently, photolithography and buffered hydrofluoric acid were used to etch away a part of insulating film 300 with a size of a square having a side of 1.0 mm on first electrode 30 to thereby form an opening and expose first electrode 30. Subsequently, on insulating film 300 and on exposed first electrode 30, EB vapor deposition was applied to successively form, as barrier film 330, an Ni layer with a thickness of 50 nm, a Pt layer with a thickness of 400 nm, and an Au layer with a thickness of 100 nm. This barrier film 330 can prevent deterioration of the characteristics of the semiconductor device due to diffusion for example of metal atoms in joint metal film 44 in the later step of bonding device support substrate 40. Subsequently, a CuW substrate was prepared as device support substrate 40. On device support substrate 40, pad electrode 43 and joint metal film 44 were formed similarly to Example G.

Next, similarly to Example G, joint metal film 44 and barrier film 330 were joined to each other. After they were joined, the state of the joint surface was observed with an ultrasonic microscope. In all of Examples I1 to I4, a joint surface defect such as generation of a void was not found. In this way, laminated substrate 3 was obtained.

Referring next to FIG. 16 (D1), support substrate 11 was partially ground, and thereafter support substrate 11 and joint film 12 of group III nitride composite substrate 1 were etched away by means of hydrofluoric acid, similarly to Example G. After this, group III nitride film 13 exposed by removal of support substrate 11 and joint film 12 from laminated substrate 3 was etched to a depth of 200 nm from the exposed main surface, similarly to Example G.

Referring next to FIG. 16 (E1), second electrode 50 having a shape in plan view of a square with a side of 1.4 mm was formed on group III nitride film 13, and device support substrate electrode 45 having a shape in plan view of a square with a side of 1.4 mm was formed on device support substrate 40, similarly to Example G. In this way, group III nitride semiconductor device 4 was obtained.

Next, group III nitride semiconductor device 4 thus obtained was diced into chips, similarly to Example G.

For the group III nitride semiconductor devices fabricated in the form of chips, as obtained in the above-described way, the Vf yield and the Vr yield were determined similarly to Example G except for the following points. Namely, in the case where the group III nitride semiconductor device was a PND, the group III nitride semiconductor device having a forward voltage Vf of 4 V or less and a reverse breakdown voltage Vr of 700 V or more was evaluated as satisfactory. The Vf yield is defined as a ratio of the number of group III nitride semiconductor devices having a forward voltage Vf of 4 V or less to the total number of group III nitride semiconductor devices, and the Vr yield is defined as a ratio of the number of group III nitride semiconductor devices having a reverse breakdown voltage Vr of 700 V or more to the total number of group III nitride semiconductor devices. Values of the characteristics of the obtained group III nitride semiconductor devices fabricated in the form of chips are summarized in Table 9.

film 13 of 0.0005 mm was fabricated similarly to Example H5 of Example H, using the aforementioned Mo substrate as support substrate 11.

TABLE 9

| | Examples | I1 | I2 | I3 | I4 |
|---|---|---|---|---|---|
| support substrate | material | $Al_2O_3$—$SiO_2$ | $Al_2O_3$—$SiO_2$ | $Al_2O_3$—$SiO_2$ | $Al_2O_3$—$SiO_2$ |
| | Young's modulus $E_s$ (GPa) | 250 | 250 | 250 | 250 |
| | thermal expansion coefficient $\alpha_s$ (×$10^{-6}$ $K^{-1}$) | 6.2 | 6.2 | 6.2 | 6.2 |
| | thermal conductivity (W · $m^{-1}$ · $K^{-1}$) | 25 | 25 | 25 | 25 |
| | thickness $t_s$ (mm) | 0.5 | 0.6 | 0.6 | 0.7 |
| group III nitride film | material | GaN | GaN | GaN | GaN |
| | Young's modulus $E_f$ (GPa) | 150 | 150 | 150 | 150 |
| | thermal expansion coefficient $\alpha_f$ (×$10^{-6}$ $K^{-1}$) | 5.9 | 5.9 | 5.9 | 5.9 |
| | thickness $t_f$ (mm) | 0.05 | 0.05 | 0.0005 | 0.05 |
| group III nitride substrate | thermal expansion coefficient difference $\Delta\alpha$ | −0.3 | −0.3 | −0.3 | −0.3 |
| | Young's modulus ratio $E_f/E_s$ | 0.6 | 0.6 | 0.6 | 0.6 |
| | diameter (mm) | 75 | 100 | 100 | 150 |
| | $E_f \cdot |\Delta\alpha|/E_s$ (×$10^{-6}$ $K^{-1}$) [parameter X] | 0.180 | 0.180 | 0.180 | 0.180 |
| | $t_s^2/t_f$ (mm) [parameter Y] | 5.0 | 7.2 | 720 | 9.8 |
| | parameter Y/X | 27.8 | 40.0 | 4000 | 54.4 |
| laminated group III nitride composite substrate | appearance evaluation | satisfactory | satisfactory | satisfactory | satisfactory |
| | in-plane average of carrier concentration (×$10^{15}$ $cm^{-3}$) | 9.1 | 9.2 | 9.0 | 9.1 |
| | in-plane standard deviation of carrier concentration (×$10^{15}$ $cm^{-3}$) | 1.5 | 1.7 | 1.5 | 1.4 |
| | evaluation of in-plane uniformity of carrier concentration | satisfactory | satisfactory | satisfactory | satisfactory |
| device support substrate | material | CuW | CuW | CuW | CuW |
| group III nitride semiconductor device | appearance of group III nitride semiconductor device | satisfactory | satisfactory | satisfactory | satisfactory |
| | Vr yield (%) [700 V or more where 1 × $10^{-3}$ $A/cm^2$] | 72 | 68 | 0 | 65 |
| | Vf yield (%) [4 V or less where 500 $A/cm^2$] | 75 | 70 | 55 | 71 |

Referring to Table 9, it is seen from Examples I1, I2, and I4 that the group III nitride semiconductor devices fabricated by using group III nitride composite substrates in which support substrates were 0.5 mm, 0.6 mm, and 0.7 mm in thickness respectively had a satisfactory in-plane uniformity of the carrier concentration in the group III nitride layer and a high Vf yield and a high Vr yield.

As also seen from Example I3, the group III nitride semiconductor device fabricated by using the group III nitride composite substrate in which the group III nitride film had an extremely small thickness of 0.0005 mm had a satisfactory in-plane uniformity of the carrier concentration in the group III nitride layer while the Vf yield and the Vr yield were lower. Reasons for this were considered as follows. Regarding the group III nitride film of the group III nitride semiconductor device of Example I3, the crystal quality was deteriorated and a high-resistance layer was formed due to implantation of hydrogen ions, and the crystal quality of the group III nitride layer epitaxially grown on the group III nitride film having the deteriorated crystal quality was also deteriorated.

Example J

Referring to FIG. 17, the present example is an example where a PND was fabricated as group III nitride semiconductor device 4 including support substrate 11.

1. Fabrication of Group III Nitride Composite Substrate

Group III nitride composite substrates were fabricated similarly to Example E, except that the group III nitride composite substrates with a diameter of 75 mm were fabricated in which an Mo substrate was used as the support substrate and the thickness of the support substrate and the thickness of the group III nitride film were different depending on the Examples as seen from Examples J1 to J4 in Table 10.

As to Example J5, referring to FIG. 13, group III nitride composite substrate 1 having a thickness of group III nitride 2. Fabrication of Group III Nitride Semiconductor Device Referring to FIG. 17 (A), on group III nitride film 13 of group III nitride composite substrate 1, group III nitride layer 20 was epitaxially grown, similarly to Example I. Specifically, $n^+$-GaN layer 203 serving as a carrier stop layer and having a carrier concentration of 2×$10^{18}$ $cm^{-3}$ and a thickness of 1 μm, $n^-$-GaN layer 204 serving as an n-type carrier drift layer and having a carrier concentration of 1×$10^{16}$ $cm^{-3}$ and a thickness of 5 μm, $p^-$-GaN layer 205 serving as a p-type layer and having an Mg concentration of 5×$10^{17}$ $cm^{-3}$ and a thickness of 0.5 μm, and $p^+$-GaN layer 206 serving as an ohmic contact layer and having an Mg concentration of 1×$10^{20}$ $cm^{-3}$ and a thickness of 0.05 μm were epitaxially grown successively. Accordingly, laminated group III nitride composite substrate 2 was obtained.

Referring next to FIG. 17 (B), mesa etching was performed on group III nitride layer 20 of laminated group III nitride composite substrate 2, similarly to Example 1. The size of the top surface of the mesa portion was a square having a side of 1.4 mm and the height of the mesa portion (depth of etching) was set to 0.8 μm. Subsequently, similarly to Example I, on the $p^+$-GaN layer 206 side of group III nitride layer 20, an Ni layer with a thickness of 50 nm and an Au layer with a thickness of 100 nm were successively formed so that the shape in plan view was a square having a side of 1.1 mm, to thereby form first electrode 30 serving as an ohmic electrode, and heat treatment was performed for alloying. In this way, group III nitride semiconductor device 4 was obtained.

Although FIG. 17 (B) shows that second electrode 50 serving as an ohmic electrode is formed on support substrate 11, the Mo substrate used as support substrate 11 in the present Example also serves as an ohmic electrode, and therefore, second electrode 50 was not provided on support substrate 11.

Group III nitride semiconductor device 4 thus obtained was fabricated into chips, similarly to Example G. The total number of group III nitride semiconductor devices fabricated in the form of chips, as obtained from the whole main surface of each group III nitride semiconductor device except for a region of 5 mm from the outer perimeter, was 150, in the case where the substrate had a diameter of 75 mm.

For the group III nitride semiconductor devices fabricated in the form of chips, as obtained in the above-described way, the Vf yield and the Vr yield were determined similarly to Example I. Values of the characteristics of the obtained group III nitride semiconductor devices fabricated in the form of chips are summarized in Table 10.

description above, and encompasses all modifications and variations equivalent in meaning and scope to the claims.

REFERENCE SIGNS LIST

1 group III nitride composite substrate; 1L, 1LS joined substrate; 2 laminated group III nitride composite substrate; 2E electrode-attached laminated group III nitride composite substrate; 3 laminated substrate; 4 group III nitride semicon-

TABLE 10

| | | Examples | | | | |
|---|---|---|---|---|---|---|
| | | J1 | J2 | J3 | J4 | J5 |
| support substrate | material | Mo | Mo | Mo | Mo | Mo |
| | Young's modulus $E_s$ (GPa) | 320 | 320 | 320 | 320 | 320 |
| | thermal expansion coefficient $\alpha_s$ (×10$^{-6}$K$^{-1}$) | 5.1 | 5.1 | 5.1 | 5.1 | 5.1 |
| | thermal conductivity (W·m$^{-1}$·K$^{-1}$) | 140 | 140 | 140 | 140 | 140 |
| | thickness $t_s$ (mm) | 0.5 | 0.5 | 0.5 | 0.5 | 0.5 |
| group III nitride film | material | GaN | GaN | GaN | GaN | GaN |
| | Young's modulus $E_f$ (GPa) | 150 | 150 | 150 | 150 | 150 |
| | thermal expansion coefficient $\alpha_f$ (×10$^{-6}$K$^{-1}$) | 5.9 | 5.9 | 5.9 | 5.9 | 5.9 |
| | thickness $t_f$ (mm) | 0.05 | 0.1 | 0.15 | 0.2 | 0.0005 |
| group III nitride composite substrate | thermal expansion coefficient difference $\Delta\alpha$ | 0.8 | 0.8 | 0.8 | 0.8 | 0.8 |
| | Young's modulus ratio $E_f/E_s$ | 0.47 | 0.47 | 0.47 | 0.47 | 0.47 |
| | diameter (mm) | 75 | 75 | 75 | 75 | 75 |
| | $E_f \cdot |\Delta\alpha|/E_s$ (×10$^{-6}$K$^{-1}$) [parameter X] | 0.375 | 0.375 | 0.375 | 0.375 | 0.375 |
| | $t_s^2/t_f$ (mm) [parameter Y] | 5.0 | 2.5 | 1.7 | 1.3 | 500 |
| | parameter Y/X | 13.3 | 6.67 | 4.53 | 3.47 | 1333 |
| laminated group III nitride composite substrate | appearance evaluation | satisfactory | satisfactory | satisfactory | satisfactory | satisfactory |
| | in-plane average of carrier concentration (×10$^{15}$ cm$^{-3}$) | 8.8 | 9.0 | 9.2 | 9.1 | 8.8 |
| | in-plane standard deviation of carrier concentration (×10$^{15}$ cm$^{-3}$) | 1.7 | 2.2 | 2.8 | 3.4 | 1.3 |
| | evaluation of in-plane uniformity of carrier concentration | satisfactory | satisfactory | unsatisfactory | unsatisfactory | satisfactory |
| group III nitride semiconductor device | appearance of group III nitride semiconductor device | satisfactory | satisfactory | satisfactory | satisfactory | satisfactory |
| | Vr yield (%) [700 V or more where 1 × 10$^{-3}$ A/cm$^2$] | 70 | 66 | 49 | 44 | 0 |
| | Vf yield (%) [4 V or less where 500 A/cm$^2$] | 75 | 70 | 53 | 50 | 0 |

Referring to Table 10, as to the group III nitride semiconductor devices in which the Mo substrate was used as the support substrate, the in-plane uniformity of the carrier concentration in the group III nitride layer was satisfactory and the Vf yield and the Vr yield were high in the cases where the thickness of the group III nitride film was 0.05 mm and 0.1 mm as seen from Examples J1 and J2, while the in-plane uniformity of the carrier concentration in the group III nitride layer was unsatisfactory and the Vf yield and the Vr yield were low in the cases where the thickness of the group III nitride film was a greater, namely 0.15 mm and 0.2 mm as seen from Examples J3 and J4.

Further, as seen from Example J5, the in-plane uniformity of the carrier concentration in the group III nitride layer was satisfactory while the Vf yield and the Vr yield were low in the case where the group III nitride film had an extremely small thickness of 0.0005 mm. Reasons for this were considered as follows. Regarding the group III nitride film of the group III nitride semiconductor device of Example J5, the crystal quality was deteriorated and a high-resistance layer was formed due to implantation of hydrogen ions, and the crystal quality of the group III nitride layer epitaxially grown on the group III nitride film having the deteriorated crystal quality was also deteriorated.

It should be construed that the embodiments and examples disclosed herein are given by way of illustration in all respects, not by way of limitation. It is intended that the scope of the present invention is defined by claims, not by the ductor device; 11 support substrate; 12, 12a, 12b, 14 joint film; 13 group III nitride film; 13D, 13Dr group III nitride film donor substrate; 13i ion implantation region; 15 support for group III nitride film donor substrate; 16D, 16Dr support-attached group III nitride film donor substrate; 20 group III nitride layer; 30 first electrode; 40 device support substrate; 43 pad electrode; 44 joint metal film; 45 device support substrate electrode; 50 second electrode; 201, 203 n$^+$-GaN layer; 202, 204 n$^-$-GaN layer; 205 p$^-$-GaN layer; 206 p$^+$-GaN layer; 300 insulating film; 330 barrier film

The invention claimed is:

1. A group III nitride composite substrate with a diameter of 75 mm or more comprising a support substrate having a thickness $t_s$ of 0.1 mm or more and 1 mm or less and a group III nitride film having a thickness $t_f$, thinner than said thickness $t_s$, of 0.01 mm or more and 0.25 mm or less that are bonded to each other, an absolute value $|\Delta\alpha|$ of a difference $\Delta\alpha$ in thermal expansion coefficient determined by subtracting a thermal expansion coefficient $\alpha_s$ of said support substrate from a thermal expansion coefficient of $\alpha_f$ said group III nitride film being 2.2×10$^{-6}$ K$^{-1}$ or less, and a Young's modulus $E_s$ and said thickness $t_s$ of said support substrate, a Young's modulus $E_f$ and said thickness $t_f$ of said group III nitride film, and said difference $\Delta\alpha$ in thermal expansion coefficient satisfying a relation defined by a formula (1):

$$t_s^2/t_f \geq 6 E_f |\Delta\alpha|/E_s \qquad (1).$$

2. A laminated group III nitride composite substrate comprising: the group III nitride composite substrate as recited in claim 1; and at least one group III nitride layer disposed on said group III nitride film of said group III nitride composite substrate.

3. A group III nitride semiconductor device comprising at least one said group III nitride layer in the laminated group III nitride composite substrate as recited in claim 2.

4. A group III nitride semiconductor device comprising: said group III nitride film in the group III nitride composite substrate as recited in claim 1; and at least one group III nitride layer disposed on said group III nitride film.

5. The group III nitride semiconductor device according to claim 3, further comprising at least one of said support substrate and a device support substrate.

6. A method for manufacturing a group III nitride composite substrate as recited in claim 1, comprising the steps of:
   forming a joined substrate with a diameter of 75 mm or more by bonding a support substrate and a group III nitride film donor substrate to each other; and
   forming said group III nitride composite substrate by cutting said group III nitride film donor substrate of said joined substrate along a plane located inwardly at a predetermined distance from a bonded main surface of said group III nitride film donor substrate.

7. A method for manufacturing a group III nitride composite substrate as recited in claim 1, comprising the steps of:
   forming a joined substrate with a diameter of 75 mm or more by bonding a support substrate and a group III nitride film donor substrate to each other; and
   forming said group III nitride composite substrate by performing at least one of grinding, polishing, and etching on a main surface of said group III nitride film donor substrate of said joined substrate, said main surface being located opposite to a bonded main surface of said group III nitride film donor substrate.

8. A method for manufacturing a group III nitride semiconductor device comprising the steps of:
   preparing the group III nitride composite substrate as recited in claim 1; and
   growing at least one group III nitride layer on said group III nitride film of said group III nitride composite substrate.

9. The method for manufacturing a group III nitride semiconductor device according to claim 8, further comprising the steps of:
   further bonding a device support substrate onto said group III nitride layer; and
   removing said support substrate from said group III nitride composite substrate.

10. The group III nitride semiconductor device according to claim 4, further comprising at least one of said support substrate and a device support substrate.

\* \* \* \* \*

UNITED STATES PATENT AND TRADEMARK OFFICE
CERTIFICATE OF CORRECTION

PATENT NO. : 9,312,340 B2
APPLICATION NO. : 14/433237
DATED : April 12, 2016
INVENTOR(S) : Makoto Kiyama et al.

It is certified that error appears in the above-identified patent and that said Letters Patent is hereby corrected as shown below:

Claims

In Claim 1, column 52, line 67, replace "$t_s^2/ \geq 6E_f \bullet |\Delta\alpha| / E_s$" with
-- $t_s^2/t_f \geq 6E_f \bullet |\Delta\alpha| / E_s$ --.

Signed and Sealed this
Nineteenth Day of July, 2016

Michelle K. Lee
*Director of the United States Patent and Trademark Office*